(12) United States Patent
Huang

(10) Patent No.: US 12,268,000 B2
(45) Date of Patent: Apr. 1, 2025

(54) MEMORY DEVICE AND METHOD OF FABRICATING THE SAME

(71) Applicant: MACRONIX International Co., Ltd., Hsinchu (TW)

(72) Inventor: Chia-Tze Huang, Hsing-Chu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 537 days.

(21) Appl. No.: 17/721,235

(22) Filed: Apr. 14, 2022

(65) Prior Publication Data

US 2023/0337426 A1    Oct. 19, 2023

(51) Int. Cl.
| | |
|---|---|
| H10B 43/27 | (2023.01) |
| H01L 23/528 | (2006.01) |
| H10B 41/10 | (2023.01) |
| H10B 41/27 | (2023.01) |
| H10B 43/10 | (2023.01) |

(52) U.S. Cl.
CPC ......... *H10B 43/27* (2023.02); *H01L 23/5283* (2013.01); *H10B 41/10* (2023.02); *H10B 41/27* (2023.02); *H10B 43/10* (2023.02)

(58) Field of Classification Search
CPC ........ H10B 43/27; H10B 43/20; H10B 43/10; H10B 41/10; H10B 41/27; H01L 23/5283; H01L 29/40117; H01L 29/792; H01L 29/0649; H01L 29/0653; H01L 29/401; H01L 29/41725; G11C 16/0483
See application file for complete search history.

(56) References Cited

U.S. PATENT DOCUMENTS

| | | |
|---|---|---|
| 2017/0278859 A1 | 9/2017 | Sharangpani et al. |
| 2018/0151588 A1* | 5/2018 | Tsutsumi ............ H01L 21/0228 |
| 2018/0350825 A1 | 12/2018 | Ogawa et al. |
| 2020/0105782 A1* | 4/2020 | Guo ...................... H10B 43/27 |
| 2020/0185406 A1* | 6/2020 | Li ........................ H10B 41/27 |
| 2020/0381450 A1* | 12/2020 | Lue ....................... H10B 43/27 |

FOREIGN PATENT DOCUMENTS

TW    202139435    10/2021

OTHER PUBLICATIONS

"Office Action of Taiwan Counterpart Application", issued on Jan. 31, 2023, p. 1-p. 5.

* cited by examiner

*Primary Examiner* — Sitaramarao S Yechuri
(74) *Attorney, Agent, or Firm* — J.C. PATENTS

(57) ABSTRACT

A memory device includes a gate stack structure, a channel pillar, a plurality of conductive pillars, and a charge storage structure. The gate stack structure is located over a dielectric substrate, and includes a plurality of gate layers and a plurality of insulating layers stacked alternately with each other. The channel pillar extends through the gate stack structure. Each of the conductive pillars includes a body portion and an extension portion. The body portion extends through the gate stack structure and is electrically connected to the channel pillar. The extension portion is below and is electrically isolated from the channel pillar. The charge storage structure is between the channel pillar and the plurality of gate layers.

16 Claims, 28 Drawing Sheets

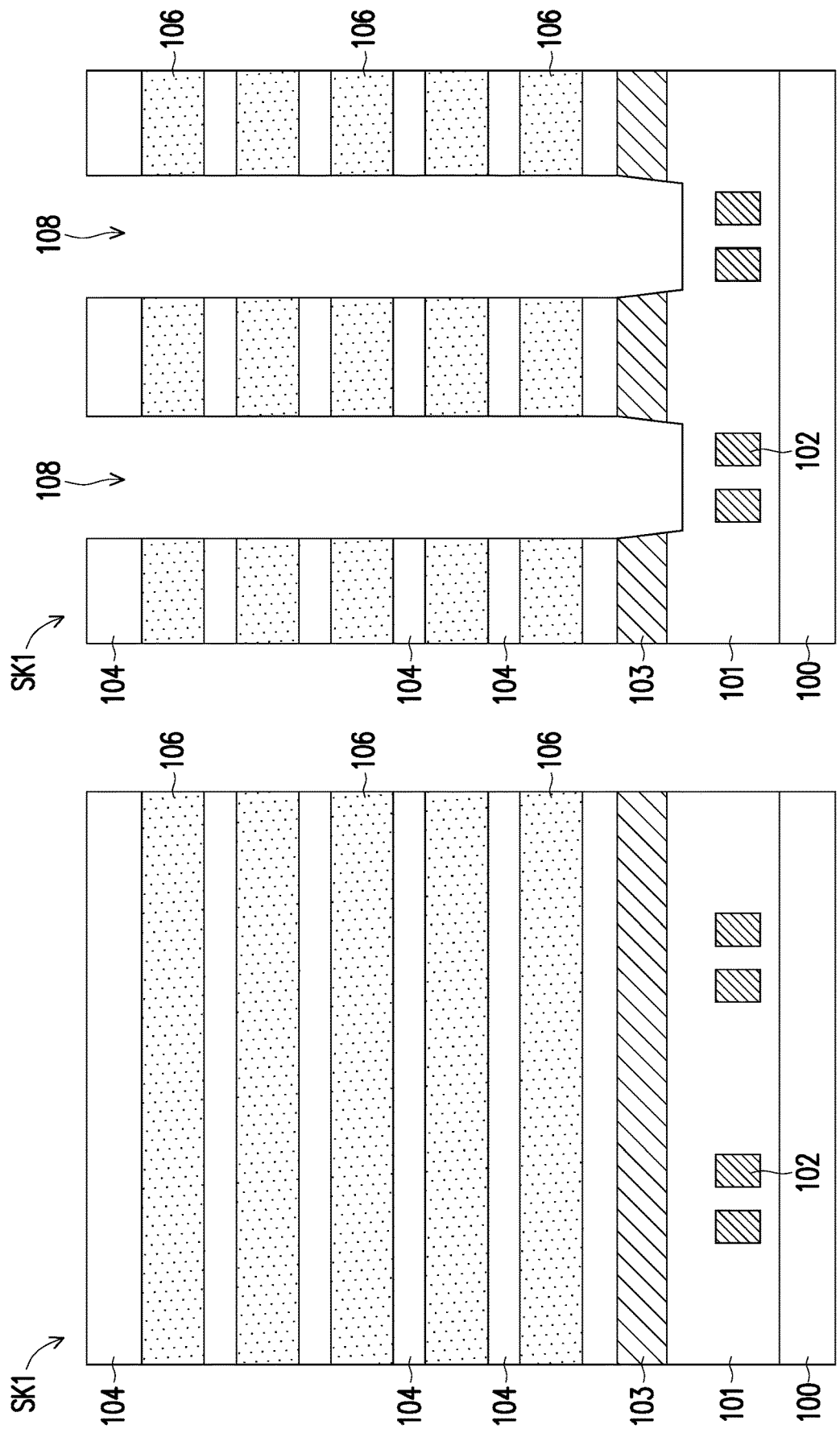

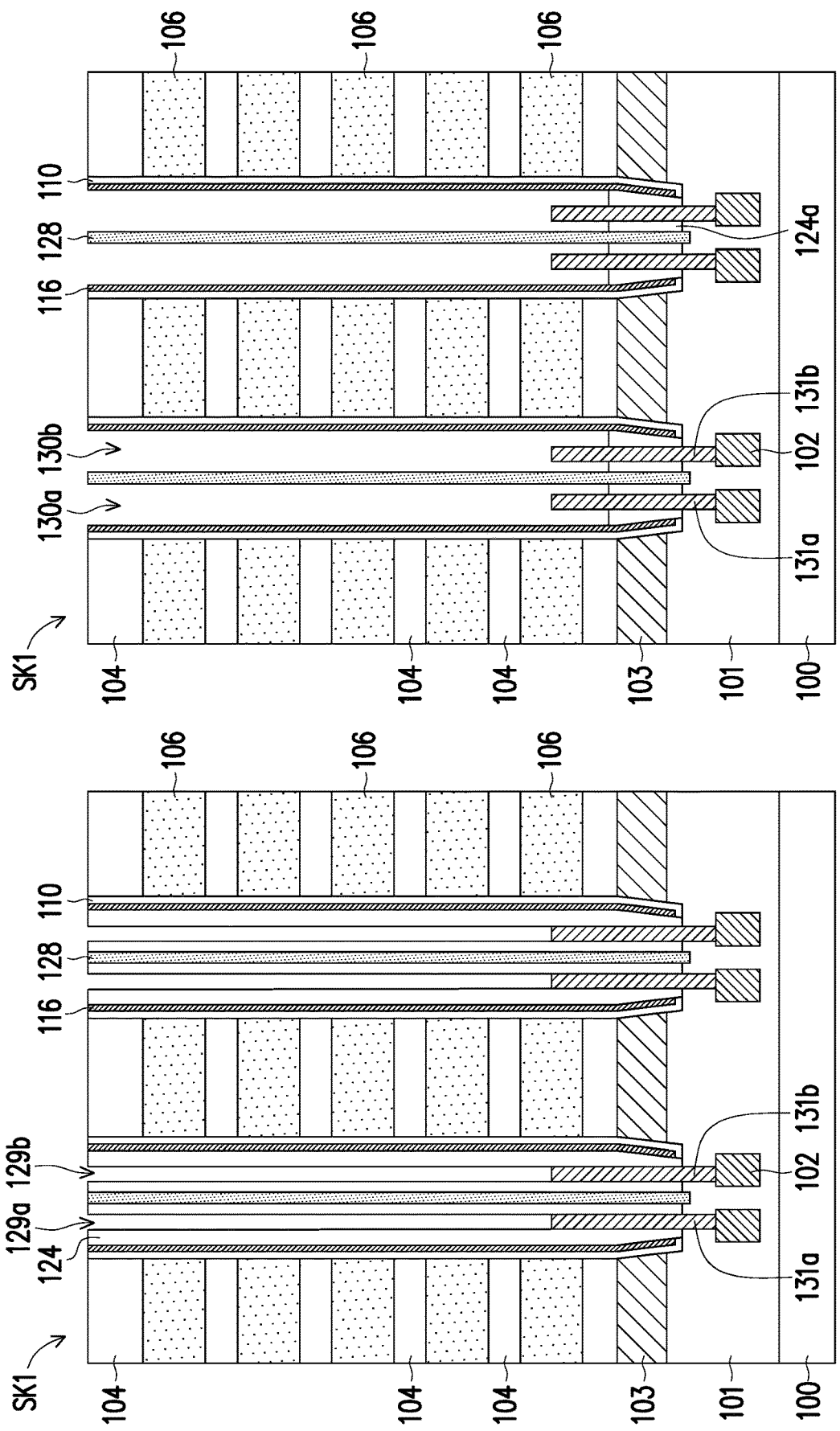

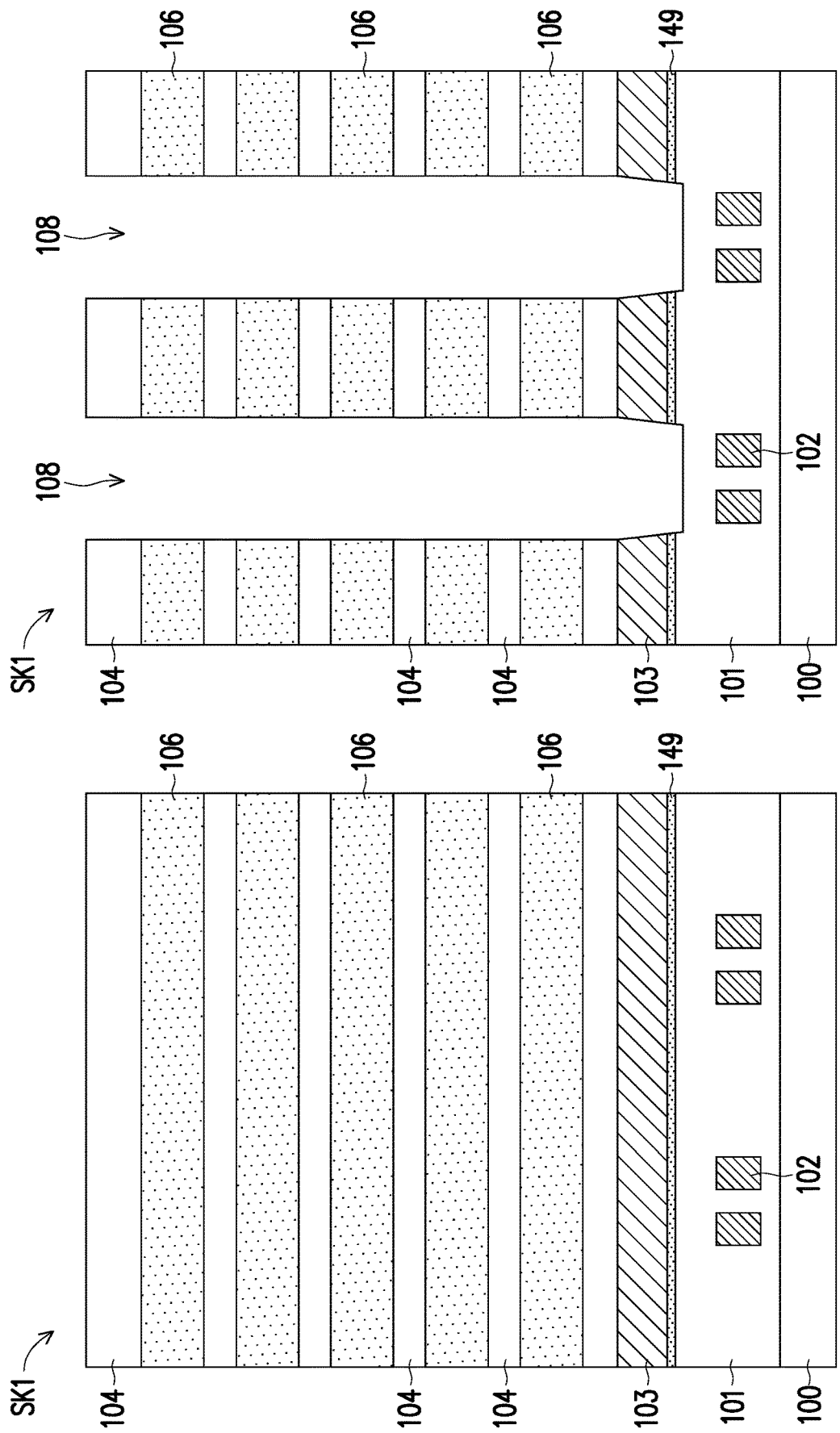

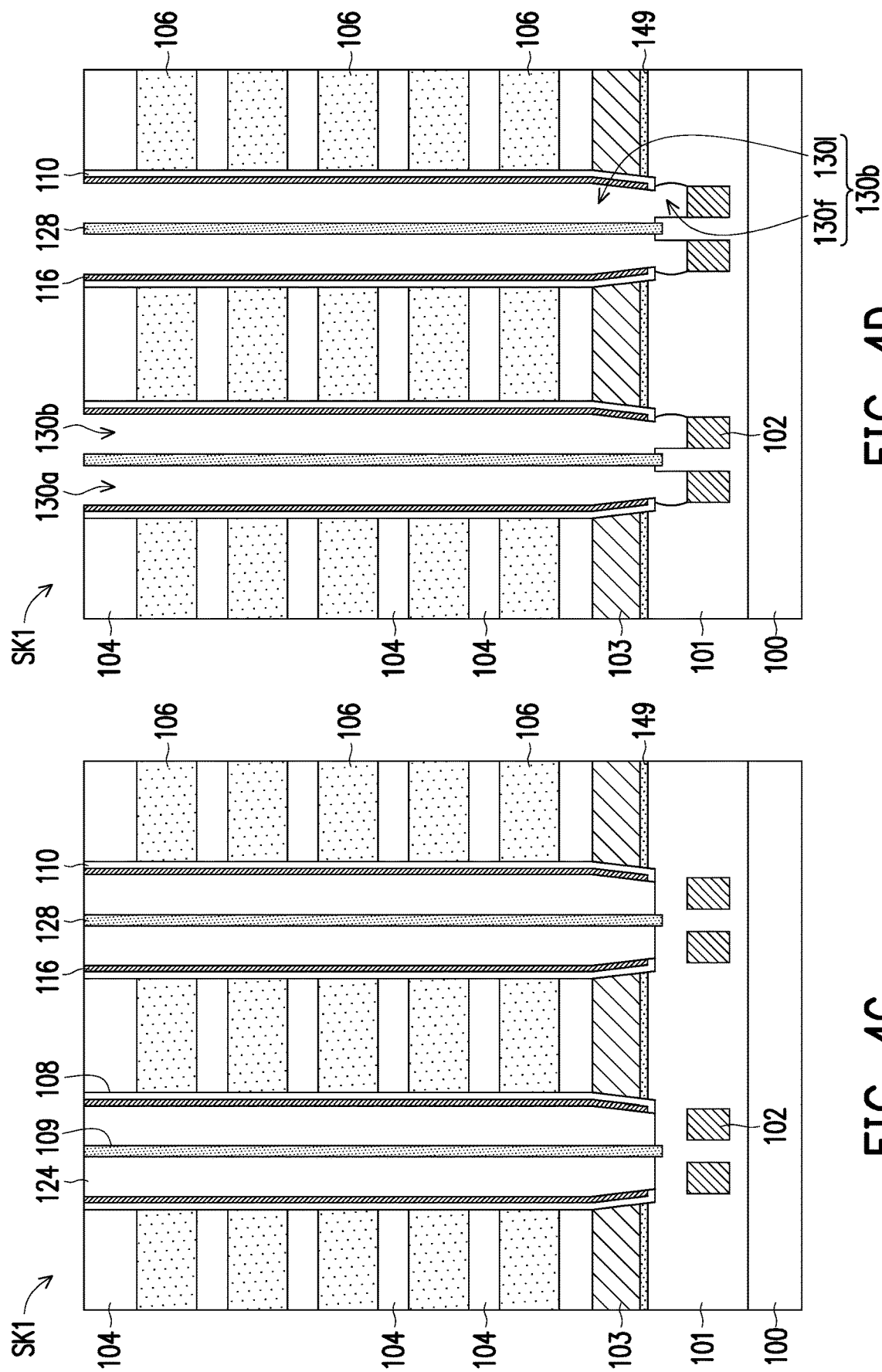

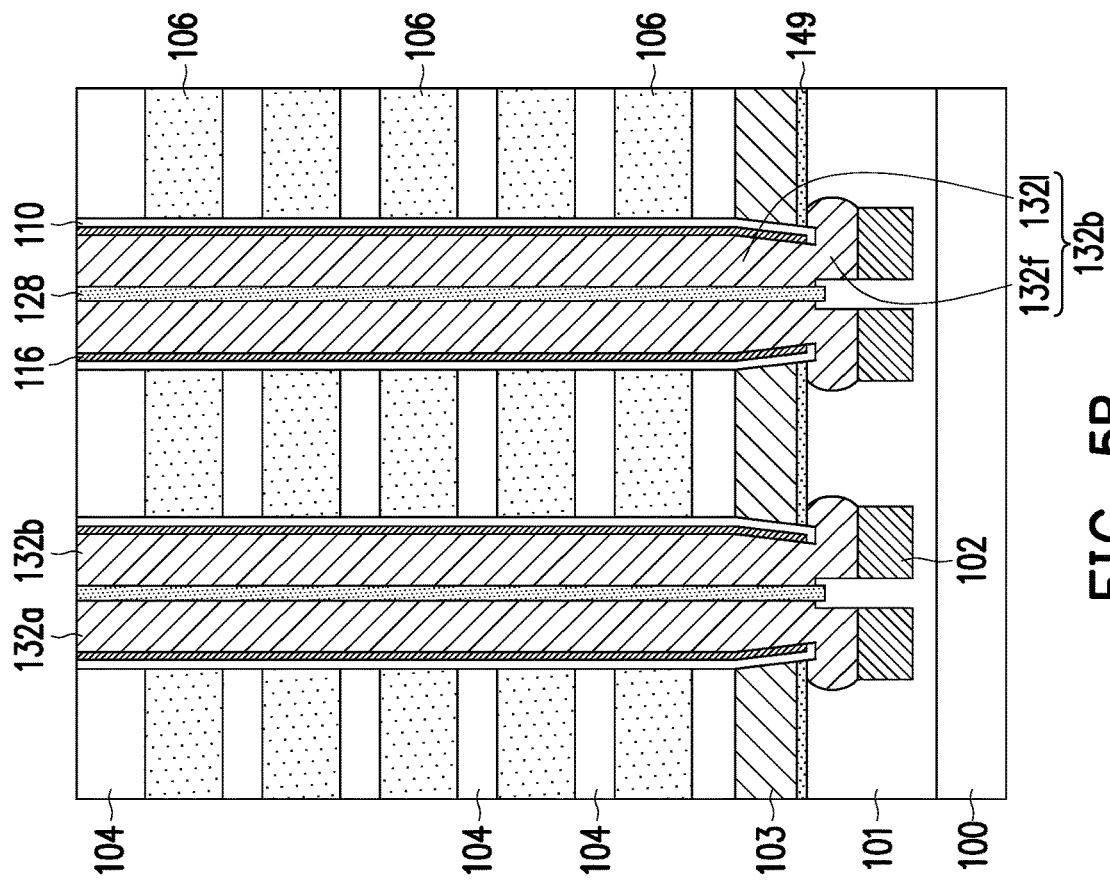
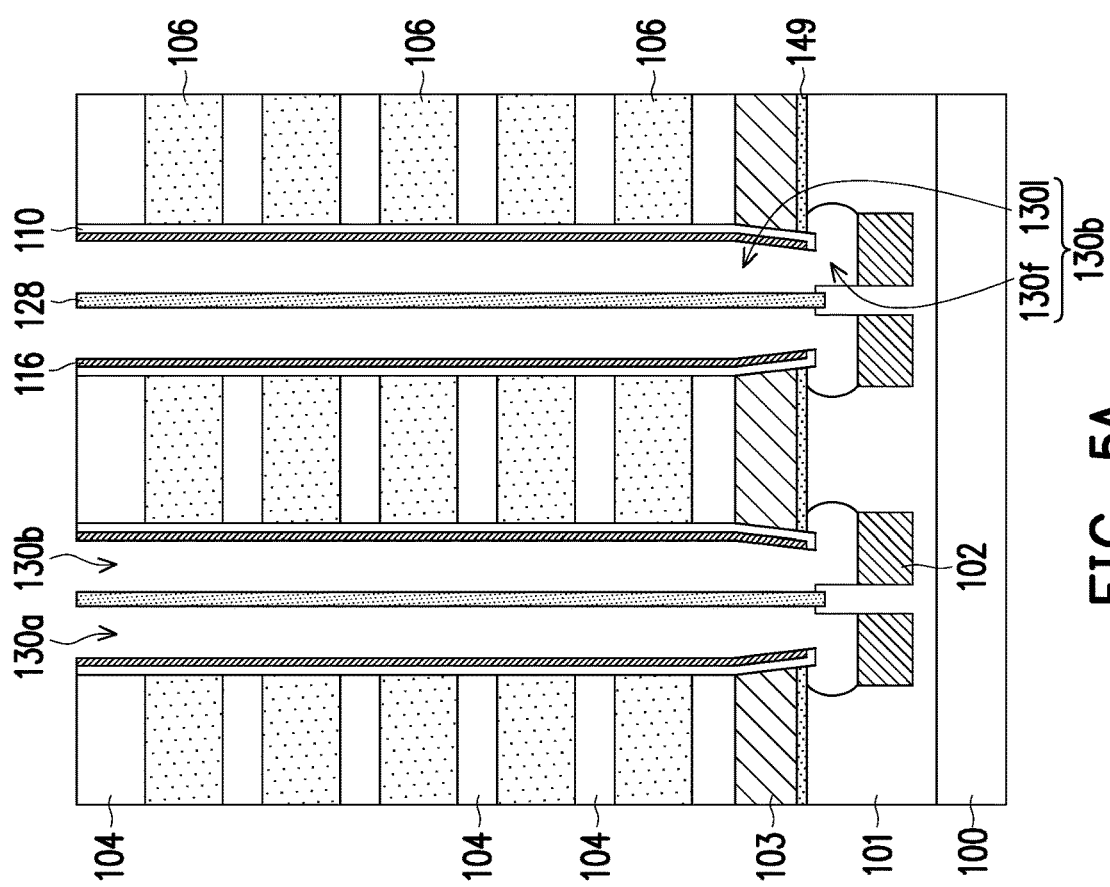
FIG. 5A
FIG. 5B

MEMORY DEVICE AND METHOD OF FABRICATING THE SAME

BACKGROUND

Technical Field

The embodiment of the disclosure relates to a semiconductor device and a method of fabricating the same, and particularly to a memory device and a method of fabricating the same.

Description of Related Art

Since a non-volatile memory has the advantage that stored data does not disappear at power-off, it becomes a widely used memory for a personal computer or other electronics equipment. Currently, the 3D memory commonly used in the industry includes a NOR memory and a NAND memory. In addition, another 3D memory is an AND memory, which may be applied to a multi-dimensional memory array with high integration and high area utilization, and has an advantage of a fast operation speed. Therefore, the development of a 3D AND flash memory device has gradually become the current trend.

SUMMARY

The embodiment of disclosure provides a memory device to avoid a short circuit between a source pillar and a grounded conductive layer or a drain pillar and the grounded conductive layer.

A memory device according to an embodiment of the disclosure includes a gate stack structure, a channel pillar, a plurality of conductive pillars, and a charge storage structure. The gate stack structure is located over a dielectric substrate, and includes a plurality of gate layers and a plurality of insulating layers stacked alternately with each other. The channel pillar extends through the gate stack structure. Each of the conductive pillars includes a body portion and an extension portion. The body portion extends through the gate stack structure and is electrically connected to the channel pillar. The extension portion is below and is electrically isolated from the channel pillar. The charge storage structure is between the channel pillar and the plurality of gate layers.

A memory device according to an embodiment of the disclosure includes a protection layer, a conductive layer, a gate stack structure, a channel pillar, a plurality of conductive pillars, and a charge storage structure. The protection layer is located over a dielectric substrate. The conductive layer is located on the protection layer. The gate stack structure is located over the conductive layer. The gate stack structure includes a plurality of gate layers and a plurality of insulating layers stacked alternately with each other. The channel pillar extends through the gate stack structure, the conductive layer and the protection layer. The plurality of conductive pillars extend through the gate stack structure, the conductive layer and the protection layer. The plurality of conductive pillars are electrically connected to the channel pillar. The charge storage structure is between the channel pillar and the plurality of gate layers.

A method of fabricating a memory device according to an embodiment of the disclosure includes the following steps. A stopper is formed over a dielectric substrate. A conductive layer is formed over the stopper. A stack structure is formed on the conductive layer, wherein the stack structure comprises a plurality of interlayers and a plurality of insulating layers stacked alternately with each other. An opening is formed in the stack structure. A channel pillar is formed in the opening. An insulating filling layer is formed in the opening. An insulating pillar is formed in a remaining space of the opening. A plurality of first holes are formed in the insulating filling layer, wherein the stopper is exposed to the plurality of first holes. A plurality of extension portions are formed in the plurality of first holes. A portion of the insulating filling layer exposed by the plurality of first hole is removed to form a plurality of second holes, wherein top surfaces of the plurality of extension portions are exposed to the plurality of second hole. A plurality of body portions are formed in the plurality of second holes, wherein the body portions are connected to the extension portions, and together with the plurality of extension portions form a plurality of conductive pillars. The plurality of interlayers is replaced with a plurality of gate layers. A plurality of charge storage structures are formed between the plurality of gate layers and the channel pillar.

In the memory device of the present disclosure embodiment, the diameter of the lower portion of the source pillar or the drain pillar is reduced to electrically isolate with the channel pillar, or the protection layer is disposed under the ground conductive layer. The issue of short circuit between the source pillar and the grounded conductive layer, or the drain pillar and the grounded conductive layer may be avoided.

The method of manufacturing the memory device of the present disclosure embodiment may be integrated with the existing process, and the process window may be increased.

BRIEF DESCRIPTION OF THE DRAWINGS

FIG. 3A to FIG. 3I are schematic cross-sectional views of a manufacturing process of a memory device according to an embodiment of the present disclosure.

FIG. 4A to FIG. 4F are schematic cross-sectional views of a manufacturing process of a memory device according to another embodiment of the present disclosure.

FIG. 5A to FIG. 5C are schematic cross-sectional views of a manufacturing process of a memory device according to yet another embodiment of the present disclosure.

DESCRIPTION OF THE EMBODIMENTS

Figure 1A:
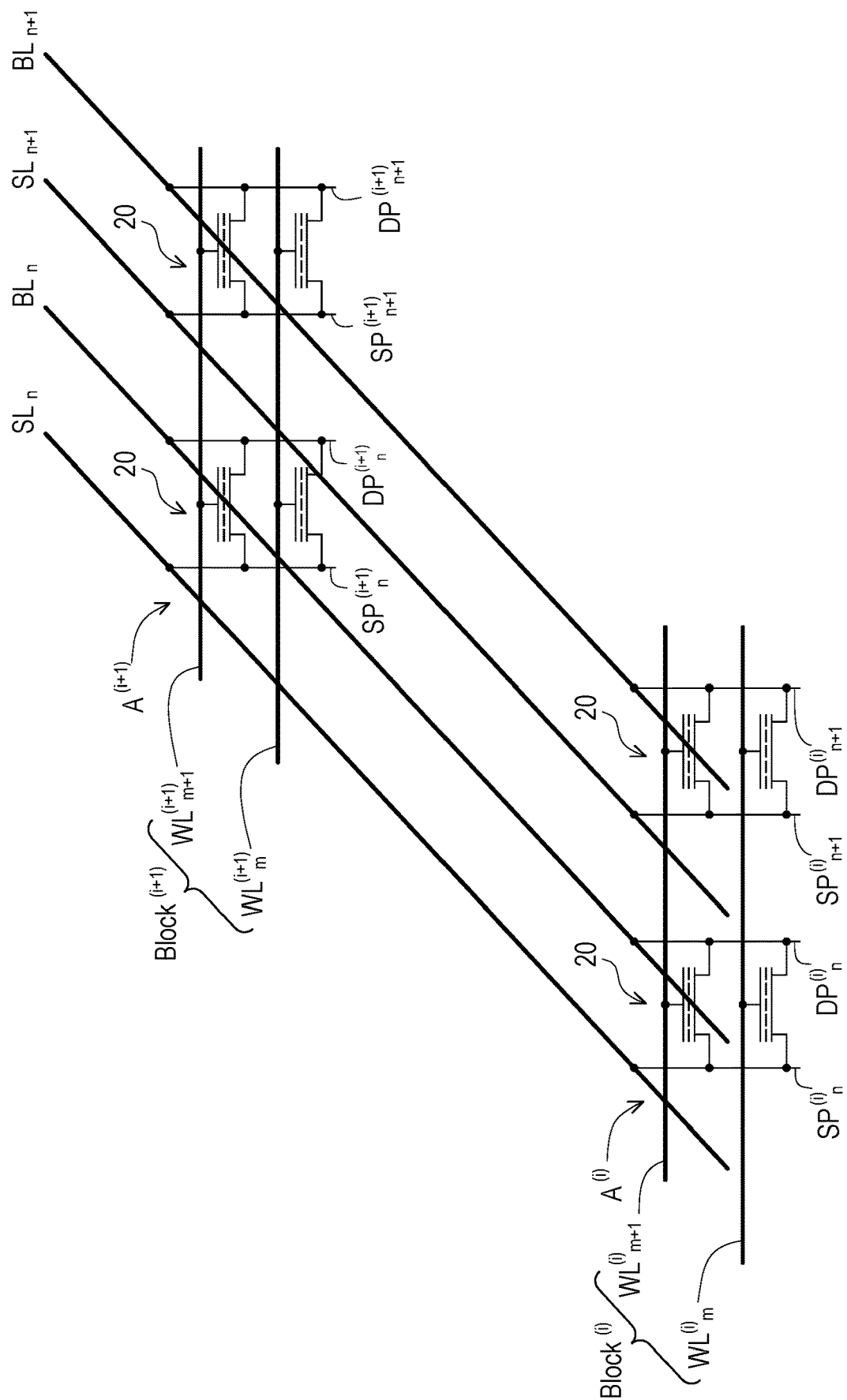
FIG. 1A shows a circuit diagram of a memory array according to some embodiments in according to the present disclosure.

FIG. 1A shows a circuit diagram of a memory array according to some embodiments in according to the present disclosure. The memory aray may be a 3D AND flash memory array. The 3D AND flash memory array is described as an example as follows, but the present disclosure is not limited thereto.

Figure 1B:
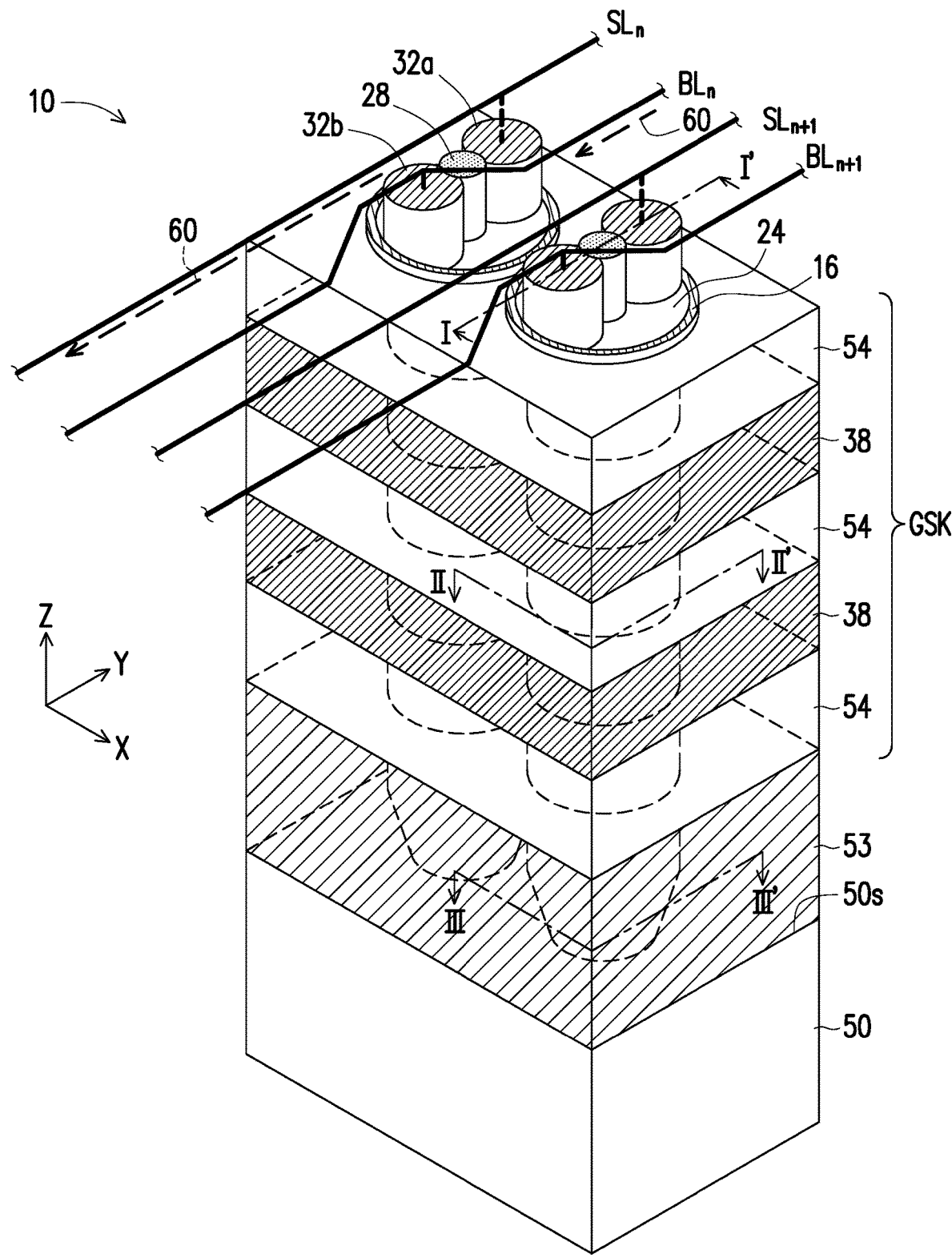
FIG. 1B shows a partial simplified perspective view of the memory array in FIG. 1A.
Figure 1C:
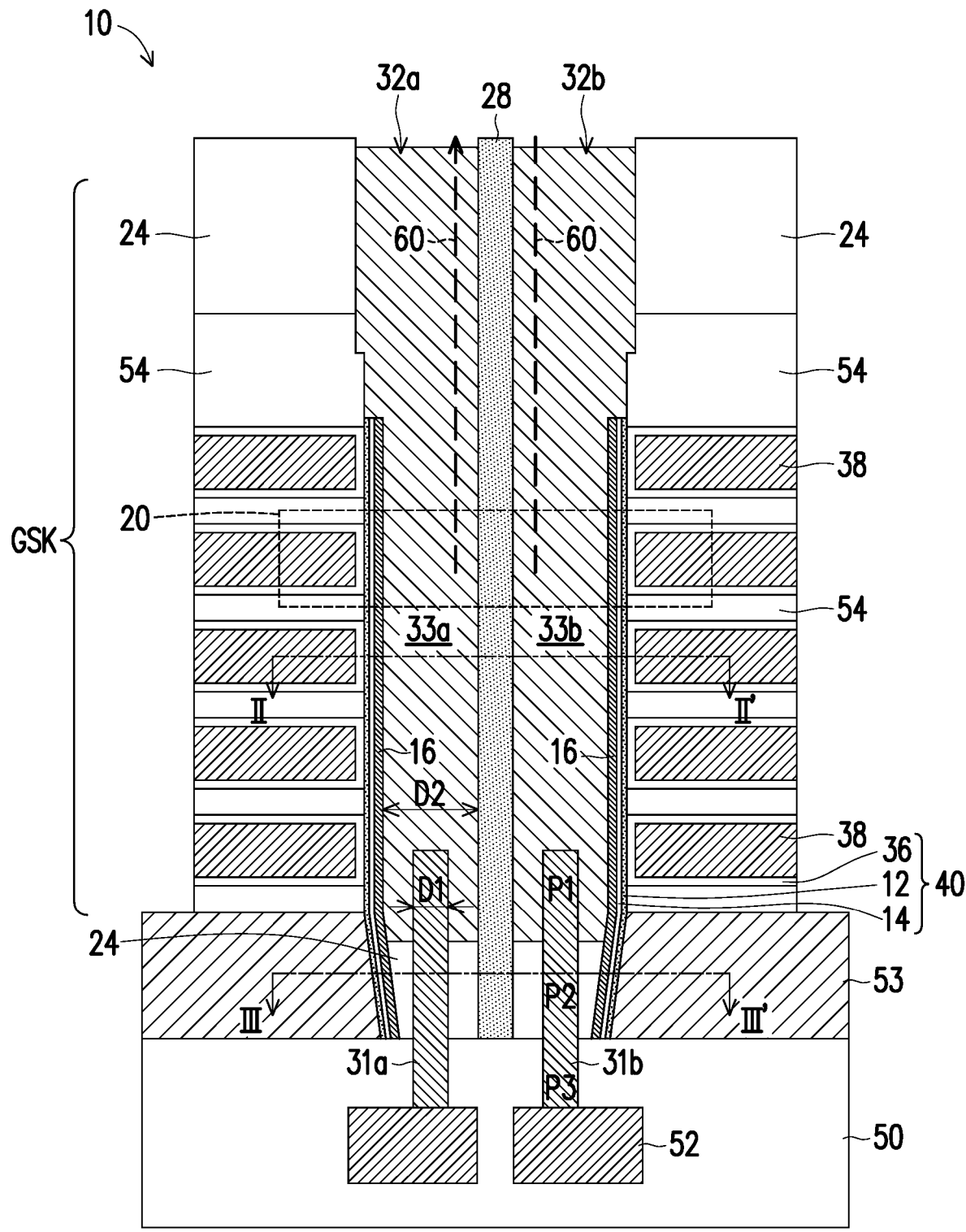
FIG. 1C and FIG. 1D show cross-sectional views taken along line I-I' of FIG. 1B.
Figure 1D:
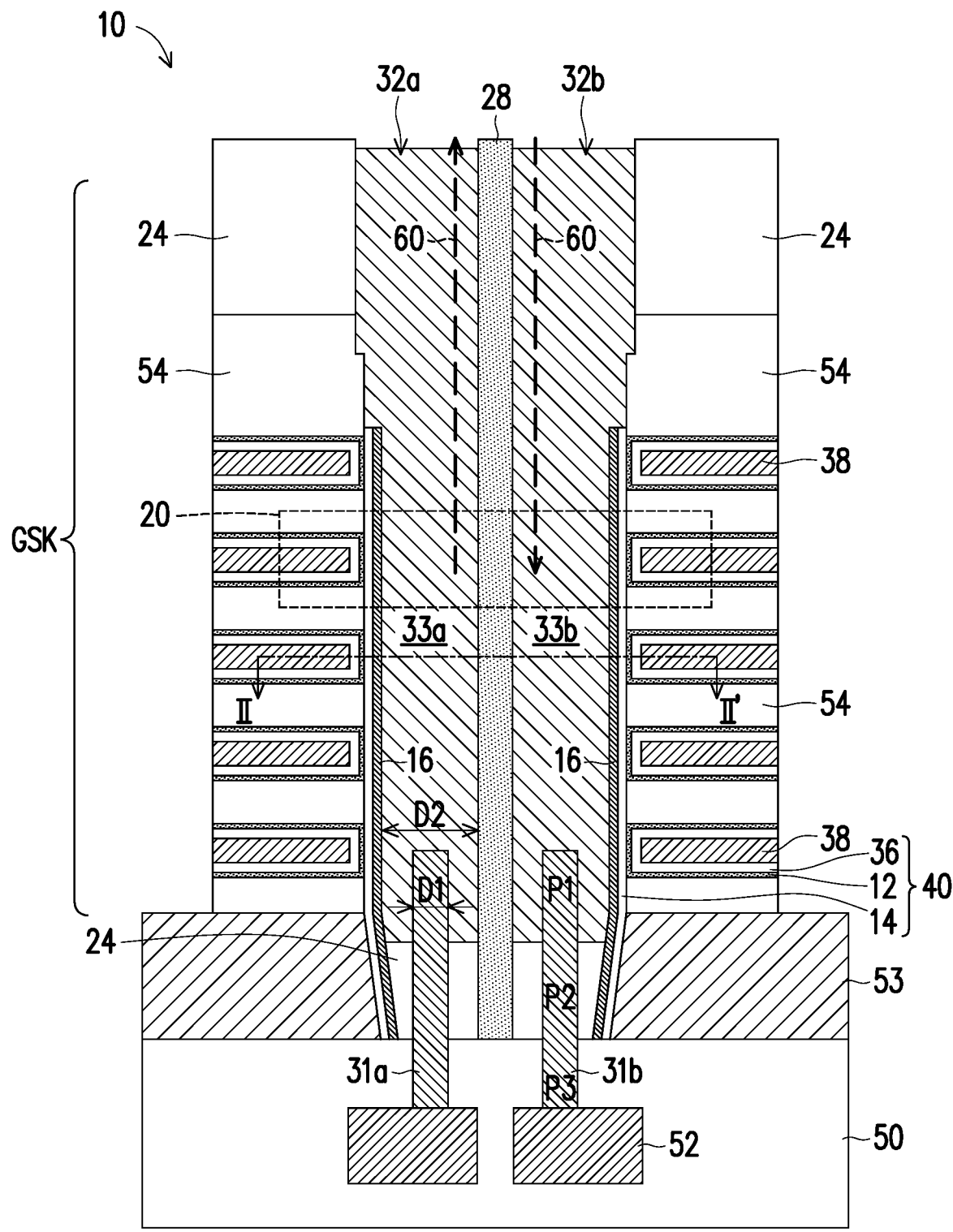
Figure 1E:
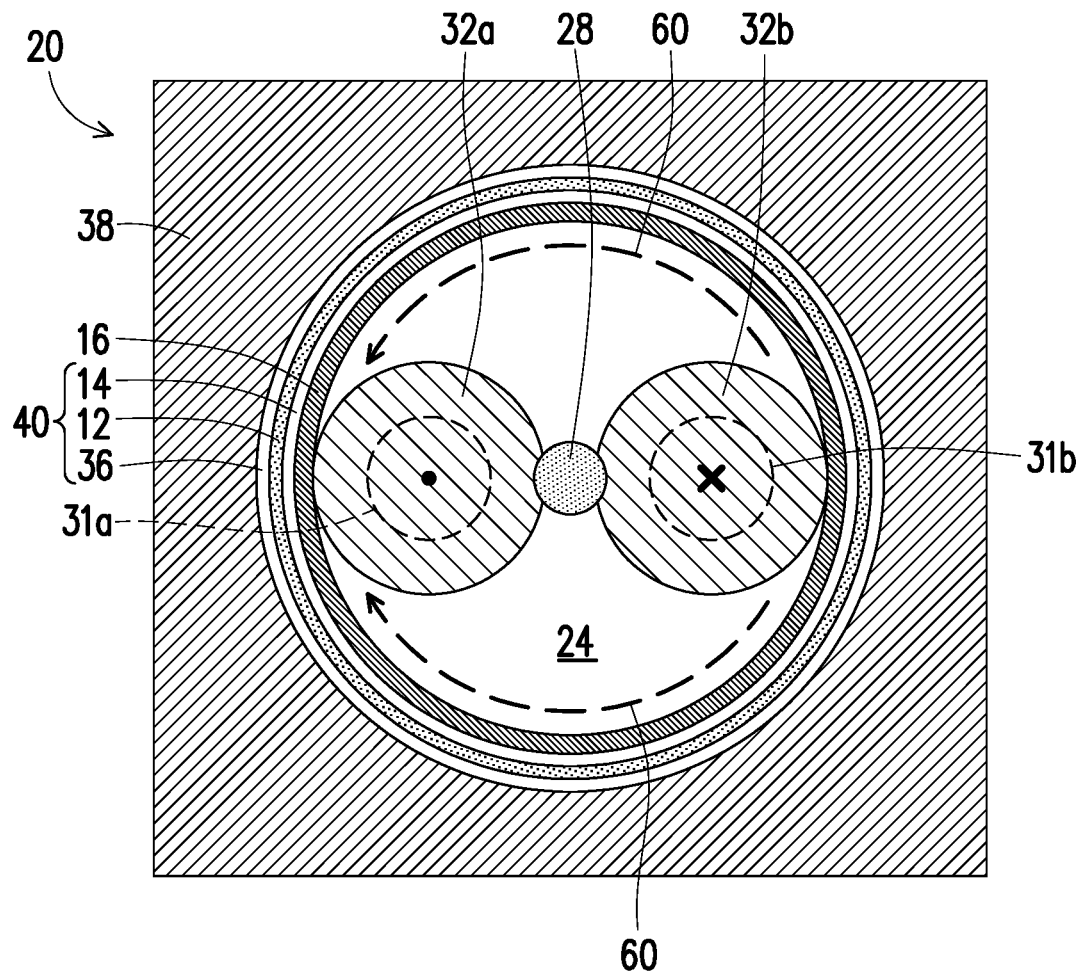
FIG. 1E shows a top view of line II-II' of FIG. 1B, FIG. 1C and FIG. 1D.
Figure 1F:
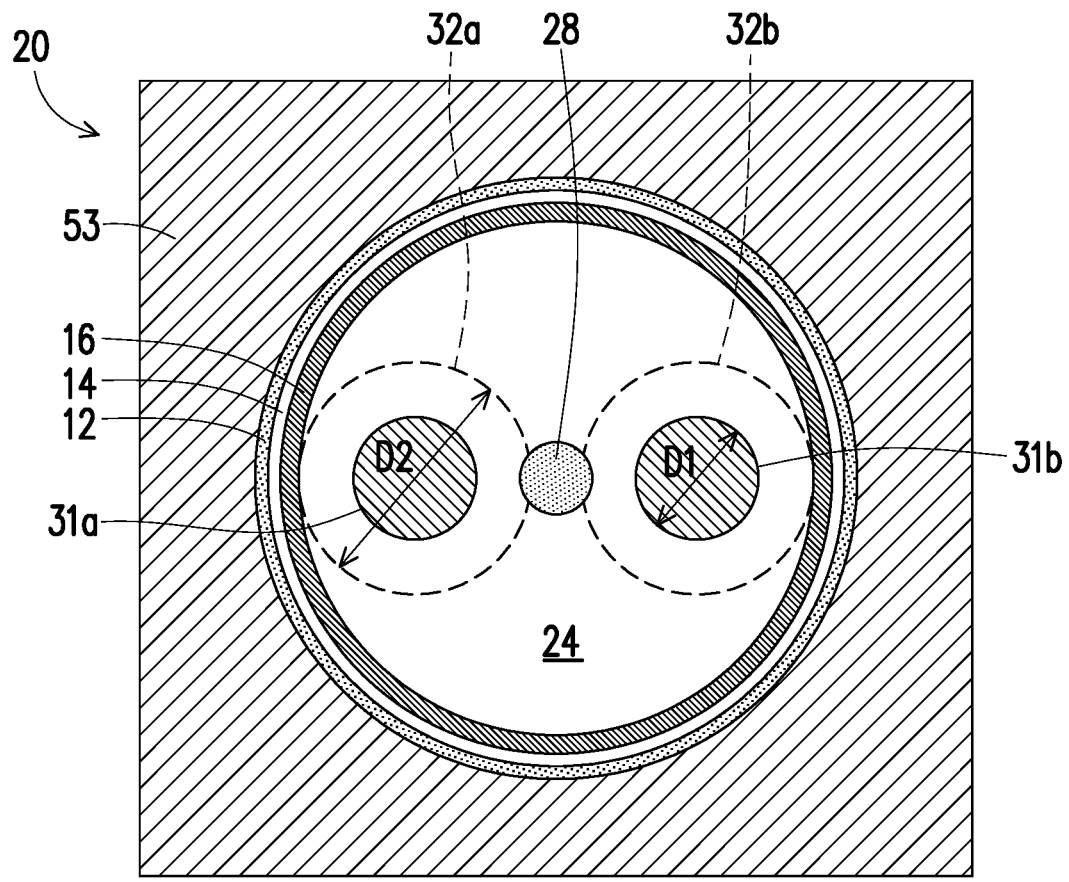
FIG. 1F shows a top view of line III-III' of FIG. 1B and FIG. 1C.

FIG. 1B shows a partial simplified perspective view of the memory array in FIG. 1A. FIG. 1C and FIG. 1D show cross-sectional views taken along line I-I' of FIG. 1B. FIG. 1E shows a top view of line II-II' of FIG. 1B, FIG. 1C and FIG. 1D. FIG. 1G to FIG. 1L show various partial simplified cross-sectional views of the memory array in FIG. 1A.

FIG. 1A shows a circuit diagram of a 3D AND flash memory array according to some embodiments in according to the present disclosure. FIG. 1B shows a partial simplified perspective view of the memory array in FIG. 1A. FIG. 1C and FIG. 1D show cross-sectional views taken along line I-I' of FIG. 1B. FIG. 1E shows a top view of line II-II' of FIG. 1B, FIG. 1C and FIG. 1D. FIG. 1G to FIG. 1L show various partial simplified cross-sectional views of the memory array in FIG. 1A.

FIG. 1A shows a circuit diagram of a 3D AND flash memory array according to some embodiments in according to the present disclosure. FIG. 1B shows a partial simplified perspective view of the memory array in FIG. 1A. FIG. 1C and FIG. 1D show cross-sectional views taken along line I-I' of FIG. 1B. FIG. 1E shows a top view of line II-II' of FIG. 1B, FIG. 1C and FIG. 1D. FIG. 1G to FIG. 1L show various partial simplified cross-sectional views of the memory array in FIG. 1A.

FIG. 1A shows a schematic view of two blocks $BLOCK^{(i)}$ and $BLOCK^{(i+1)}$ of a vertical AND memory array 10 arranged in rows and columns. The block $BLOCK^{(i)}$ includes a memory array $A^{(i)}$. A row (e.g., an $(m+1)^{th}$ row) of the memory array $A^{(i)}$ is a set of AND memory cells 20 having a common word line (e.g., $WL^{(i)}_{m+1}$). The AND memory cells 20 of the memory array $A^{(i)}$ in each row (e.g., the $(m+1)^{th}$ row) correspond to a common word line (e.g., $WL^{(i)}_{m+1}$) and are coupled to different source pillars (e.g., $SP^{(i)}_n$ and $SP^{(i)}_{n+1}$) and drain pillars (e.g., $DP^{(i)}_n$ and $DP^{(i)}_{n+1}$), so that the AND memory cells 20 are logically arranged in a row along the common word line (e.g., $WL^{(i)}_{m+1}$).

A column (e.g., an $n^{th}$ column) of the memory array $A^{(i)}$ is a set of AND memory cells 20 having a common source pillar (e.g., $SP^{(i)}_n$) and a common drain pillar (e.g., $DP^{(i)}_n$). The AND memory cells 20 of the memory array $A^{(i)}$ in each column (e.g., the $n^{th}$ column) correspond to different word lines (e.g., $WL^{(i)}_{m+1}$ and $WL^{(i)}_m$) and are coupled to a common source pillar (e.g., $SP^{(i)}_n$) and a common drain pillar (e.g., $DP^{(i)}_n$). Hence, the AND memory cells 20 of the memory array $A^{(i)}$ are logically arranged in a column along the common source pillar (e.g., $SP^{(i)}_n$) and the common drain pillar (e.g., $DP^{(i)}_n$). In the physical layout, according to the fabrication method as applied, the columns or rows may be twisted and arranged in a honeycomb pattern or other patterns for high density or other reasons.

In FIG. 1A, in the block $BLOCK^{(i)}$, the AND memory cells 20 in the $n^{th}$ column of the memory array $A^{(i)}$ share a common source pillar (e.g., $SP^{(i)}_n$) and a common drain pillar (e.g., $DP^{(i)}_n$). The AND memory cells 20 in an $(n+1)^{th}$ column share a common source pillar (e.g., $SP^{(i)}_{n+1}$) and a common drain pillar (e.g., $DP^{(i)}_{n+1}$).

The common source pillar (e.g., $SP^{(i)}_n$) is coupled to a common source line (e.g., $SL_n$) and the common drain pillar (e.g., $DP^{(i)}_n$) is coupled to a common bit line (e.g., $BL_n$). The common source pillar (e.g., $SP^{(i)}_{n+1}$) is coupled to a common source line (e.g., $SL_{n+1}$) and the common drain pillar (e.g., $DP^{(i)}_{n+1}$) is coupled to a common bit line (e.g., $BL_{n+1}$).

Likewise, the block $BLOCK^{(i+1)}$ includes a memory array $A^{(i+1)}$, which is similar to the memory array $A^{(i)}$ in the block $BLOCK^{(i)}$. A row (e.g., an $(m+1)^{th}$ row) of the memory array $A^{(i+1)}$ is a set of AND memory cells 20 having a common word line (e.g., $WL^{(i+1)}_{m+1}$). The AND memory cells 20 of the memory array $A^{(i+1)}$ in each row (e.g., the $(m+1)^{th}$ row) correspond to a common word line (e.g., $WL^{(i+1)}_{m+1}$) and are coupled to different source pillars (e.g., $SP^{(i+1)}_n$ and $SP^{(i+1)}_{n+1}$) and drain pillars (e.g., $DP^{(i+1)}_n$ and $DP^{(i+1)}_{n+1}$). A column (e.g., an $n^{th}$ column) of the memory array $A^{(i+1)}$ is a set of AND memory cells 20 having a common source pillar (e.g., $SP^{(i+1)}_n$) and a common drain pillar (e.g., $DP^{(i+1)}_n$). The AND memory cells 20 are integrated and connected in parallel, and thus may be also referred to as a memory string. The AND memory cells 20 of the memory array $A^{(i+1)}$ in each column (e.g., the $n^{th}$ column) correspond to different word lines (e.g., $WL^{(i+1)}_{m+1}$ and $WL^{(i+1)}_m$) and are coupled to a common source pillar (e.g., $SP^{(i+1)}_n$) and a common drain pillar (e.g., $DP^{(i+1)}_n$). Hence, the AND memory cells 20 of the memory array $A^{(i+1)}$ are logically arranged in a column along the common source pillar (e.g., $SP^{(i+1)}_n$) and the common drain pillar (e.g., $DP^{(i+1)}_n$).

The block $BLOCK^{(i+1)}$ and the block $BLOCK^{(i)}$ share source lines (e.g., $SL_n$ and $SL_{n+1}$) and bit lines (e.g., $BL_n$ and $BL_{n+1}$). Therefore, the source line $SL_n$ and the bit line $BL_n$ are coupled to the $n^{th}$ column of AND memory cells 20 in the AND memory array $A^{(i)}$ of the block $BLOCK^{(i)}$, and are coupled to the $n^{th}$ column of AND memory cells 20 in the AND memory array $A^{(i+1)}$ of the block $BLOCK^{(i+1)}$. Similarly, the source line $SL_{n+1}$ and the bit line $BL_{n+1}$ are coupled to the $(n+1)^{th}$ column of AND memory cells 20 in the AND memory array $A^{(i)}$ of the block $BLOCK^{(i)}$, and are coupled to the $(n+1)^{th}$ column of AND memory cells 20 in the AND memory array $A^{(i+1)}$ of the block $BLOCK^{(i+1)}$.

Referring to FIG. 1B to FIG. 1D, the memory array 10 may be disposed over an interconnect structure of a semiconductor die, for example, being disposed on one or more active devices (e.g., transistors) formed on a semiconductor substrate. Therefore, the dielectric substrate 50 is, for example, a dielectric layer (e.g., a silicon oxide layer) over a conductive interconnect structure formed on a silicon substrate. The memory array 10 may include a gate stack structure GSK, a plurality of channel pillars 16, a plurality of first conductive pillars (also referred to as source pillars) 32a, a plurality of second conductive pillars (also referred to as drain pillars) 32b, and a plurality of charge storage structures 40.

Referring to FIG. 1B, the gate stack structure GSK is formed on the dielectric substrate 50 in the array region (not shown) and the staircase region (not shown). The gate stack structure GSK includes a plurality of gate layers (also referred to as word lines) 38 and a plurality of insulating layer 54 vertically stacked on a surface $50s$ of the dielectric substrate 50. In a direction Z, the gate layers 38 are electrically isolated from each other by the insulating layer 54 disposed therebetween. The gate layers 38 extend in a direction parallel to the surface $50s$ of the dielectric substrate 50. The gate layers 38 in the staircase region may have a staircase structure (not shown). Therefore, a lower gate layer 38 is longer than an upper gate layer 38, and the end of the lower gate layer 38 extends laterally beyond the end of the upper gate layer 38. A contact (not shown) for connecting the gate layer 38 may land on the end of the gate layer 38 to connect the gate layers 38 respectively to conductive lines.

Referring to FIG. 1B to FIG. 1D, the memory array 10 further includes a plurality of channel pillars 16 stacked along the direction Z. In some embodiments, each of the channel pillars 16 has an annular shape from a top view. A material of the channel pillars includes a semiconductor material, such as undoped polysilicon.

Referring to FIG. 1B to FIG. 1D, the memory array 10 further includes an insulating pillar 28, a plurality of first conductive pillars 32a, and a plurality of second conductive pillars 32b. In this example, the first conductive pillars 32a serve as source pillars. The second conductive pillars 32b serve as drain pillars. The first conductive pillar 32a, the second conductive pillar 32b and the insulating pillar 28 are each extend in a direction (i.e., the direction Z) perpendicular to the surface of the gate layer 38. The first conductive pillar 32a and the second conductive pillar 32b are separated from each other by the insulating pillar 28. The first conductive pillar 32a and the second conductive pillar 32b are electrically connected to the channel pillars 16. The first conductive pillar 32a and the second conductive pillar 32b include doped polysilicon or metal materials. The insulating pillar 28 is, for example, silicon nitride.

Referring to FIG. 1C and FIG. 1D, the charge storage structures 40 are disposed between the channel pillars 16 and the gate layers 38. Each of the charge storage structure 40 may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14 and the blocking layer 36 include silicon oxide. The charge storage layer 12 includes silicon nitride or other materials capable of trapping charges. In some embodiments, as shown in FIG. 1C, a portion (the tunneling layer 14 and the charge storage layer 12) of the charge storage structure 40 continuously extends in a direction (i.e., the direction Z) perpendicular to the gate layer 38, and the other portion (the blocking layer 36) of the charge storage structure 40 surrounds the gate layer 38. In other embodiments, as shown in FIG. 1D, the charge storage structure 40 (the tunneling layer 14, the charge storage layer 12, and the blocking layer 36) surrounds the gate layer 38.

Referring to FIG. 1E, the charge storage structure 40, the channel pillar 16, the source pillar 32a, and the drain pillar 32b are surrounded by the gate layer 38, and a memory cell 20 is defined. According to different operation methods, a 1-bit operation or a 2-bit operation may be performed on the memory cell 20. For example, when a voltage is applied to the source pillar 32a and the drain pillar 32b, since the source pillar 32a and the drain pillar 32b are connected to the channel pillar 16, electrons may be transferred along the channel pillar 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32a and the drain pillar 32b. For an operation involving source side injection, channel-hot-electron injection, or band-to-band tunneling hot carrier injection, electrons or holes may be locally trapped in the charge storage structure 40 adjacent to one of the source pillar 32a and the drain pillar 32b. Accordingly, a single level cell (SLC, 1 bit) or multi-level cell (MLC, greater than or equal to 2 bits) operation may be performed on the memory cell 20.

Referring to FIG. 1A and FIG. 1B, during operation, a voltage is applied to a selected word line (gate layer) 38; for example, when a voltage higher than a corresponding threshold voltage ($V_{th}$) of the corresponding memory cell 20 is applied, the channel pillar 16 intersecting the selected word line 38 is turned on to allow a current to enter the drain pillar 32b from the bit line $BL_n$ or $BL_{n+1}$ (shown in FIG. 1B), flow to the source pillar 32a via the turned-on channel region (e.g., in a direction indicated by arrow 60), and finally flow to the source line $SL_n$ or $S_{n+1}$ (shown in FIG. 1B).

Referring to FIG. 1C and FIG. 1D, in some embodiments of the present disclosure, the source pillars 32a and the drain pillars 32b also extend through the conductive layer 53 between the gate stack structure GSK and the dielectric substrate 50. The conductive layer 53 may also be referred to as a dummy gate s which are used to close the pathway of the leakage current. The material of the conductive layer 53 is, for example, polysilicon.

Referring to FIG. 1C and FIG. 1D, the source pillar 32a includes a body portion 33a and an extension portion 31a. The drain column 32b includes a body portion 33b and an extension portion 31b. The body portions 33a and 33b extend through the gate stack structure GSK and are electrically connected to the channel pillar 16.

Referring to FIG. 1C and FIG. 1D, the extension portions 31a and 31b are located below the body portions 33a and 33b and are connected to the body portions 33a and 33b respectively. In some embodiments, the extension portions 31a and 31b also extend upward into the body portions 33a and 33b, so that the top surfaces and upper sidewalls of the extension portions 31a, 31b are covered by the body portions 33a and 33b respectively. Therefore, there is an interface between the top surface and the upper sidewall of the extension portions 31a, 31b and the body portions 33a and 33b.

Referring to FIG. 1C, FIG. 1D, FIG. 1E, and FIG. 1F, the diameter D1 of the extension portions 31a and 31b is smaller than the diameter D2 of the body portions 33a and 33b respectively. The extension portions 31a, 31b are laterally spaced apart from the channel pillar 16 by a first non-zero distance. The extension portions 31a, 31b are laterally spaced apart from the insulating pillar 28 by a second non-zero distance. The first non-zero distance may be the same as or different from the second non-zero distance. The extension portions 31a and 31b, which are not covered by the body portions 33a and 33b, are electrically isolated from the channel pillar 16 by isolators 24, and the extension portions 31a and 31b are also electrically isolated from the insulating pillar 28 by the isolators 24.

Referring to FIG. 1C and FIG. 1D, the material of the extension portions 31a and 31b is different from the material of the body portions 33a and 33b. The number of crystal phases of the extension portions 31a and 31b is lower than that of the body portions 33a and 33b. The material of the extension portions 31a, 31b includes single crystal silicon, and the material of the body portions 33a and 33b includes doped polysilicon.

Referring to FIG. 1C and FIG. 1D, the extension portions 31a and 31b extend through the conductive layer 53 and land on a stopper 52 under the conductive layer 53. The stopper 52 may be used as an etch stop layer. In addition, the stopper 52 facilitates the formation of the extensions 31a and 31b. For example, the stopper 52 may serve as a seed layer, and the extensions 31a and 31b may be formed by an epitaxial growth process. The material of stopper 52 includes polysilicon, single crystal silicon or a combination thereof.

Referring to FIG. 1C and FIG. 1D, in other words, the extension portions 31a and 31b include a first portion P1, a second portion P2 and a third portion P3, respectively. The first portion P1 is connected to the body portion 33a or 33b, and the top surface and sidewall of the first portion P1 are covered by the body portions 33a and 33b. The second portion P2 is located between and connected to the first portion P1 and the third portion P3. The sidewall of the second portion P2 is covered by the isolator 24. The second portion P2 is separated from the channel pillar 16 by a first non-zero distance, the second portion P2 is separated from the insulating pillar 28 by a second non-zero distance. The bottom of the third portion P3 is connected to the stopper 52, and the sidewall of the third portion P3 is laterally covered by the dielectric substrate 50.

The stopper 52 may be stop bulks 52a, a stop layer 52b, stop grains 52c, a substrate 52d, or a combination thereof, as shown in FIG. 2A to FIG. 2D respectively.

Figure 2A:
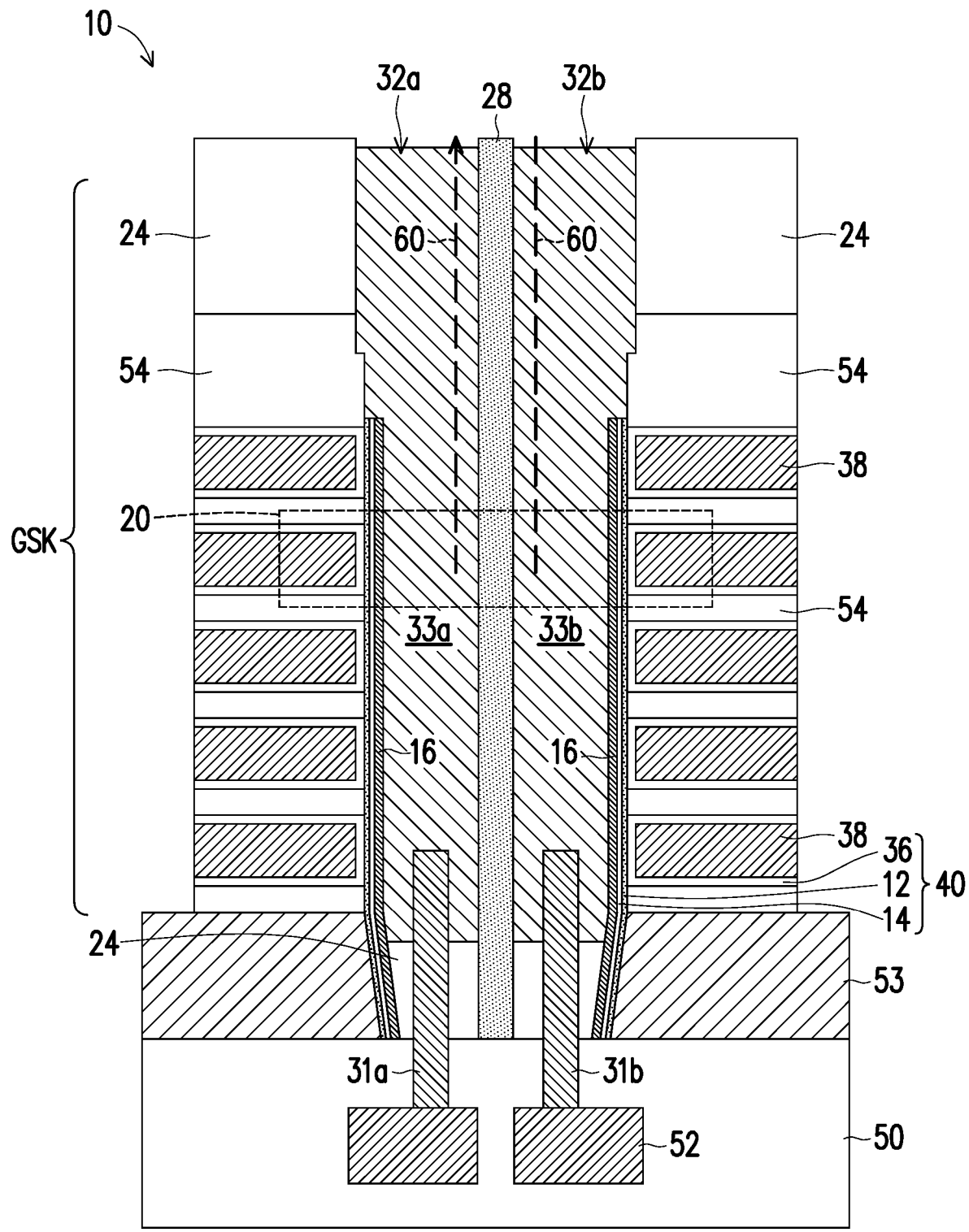
FIG. 2A to FIG. 2D are schematic cross-sectional views of various memory devices according to embodiments of the present disclosure.

Referring to FIG. 2A, the stopper 52 is the stop bulks 52a. The stop bulks 52a are connected to the source pillar 32a and the drain pillar 32b respectively and are electrically isolated from each other. The stop bulks 52a may be formed by first forming a stop film and then patterning through lithography and etching processes. In some embodiments, the extension portions 31a and 31b of the source pillar 32a and the drain pillar 32b may be formed by an epitaxial growth process on the stop bulks 52a.

Figure 2B:
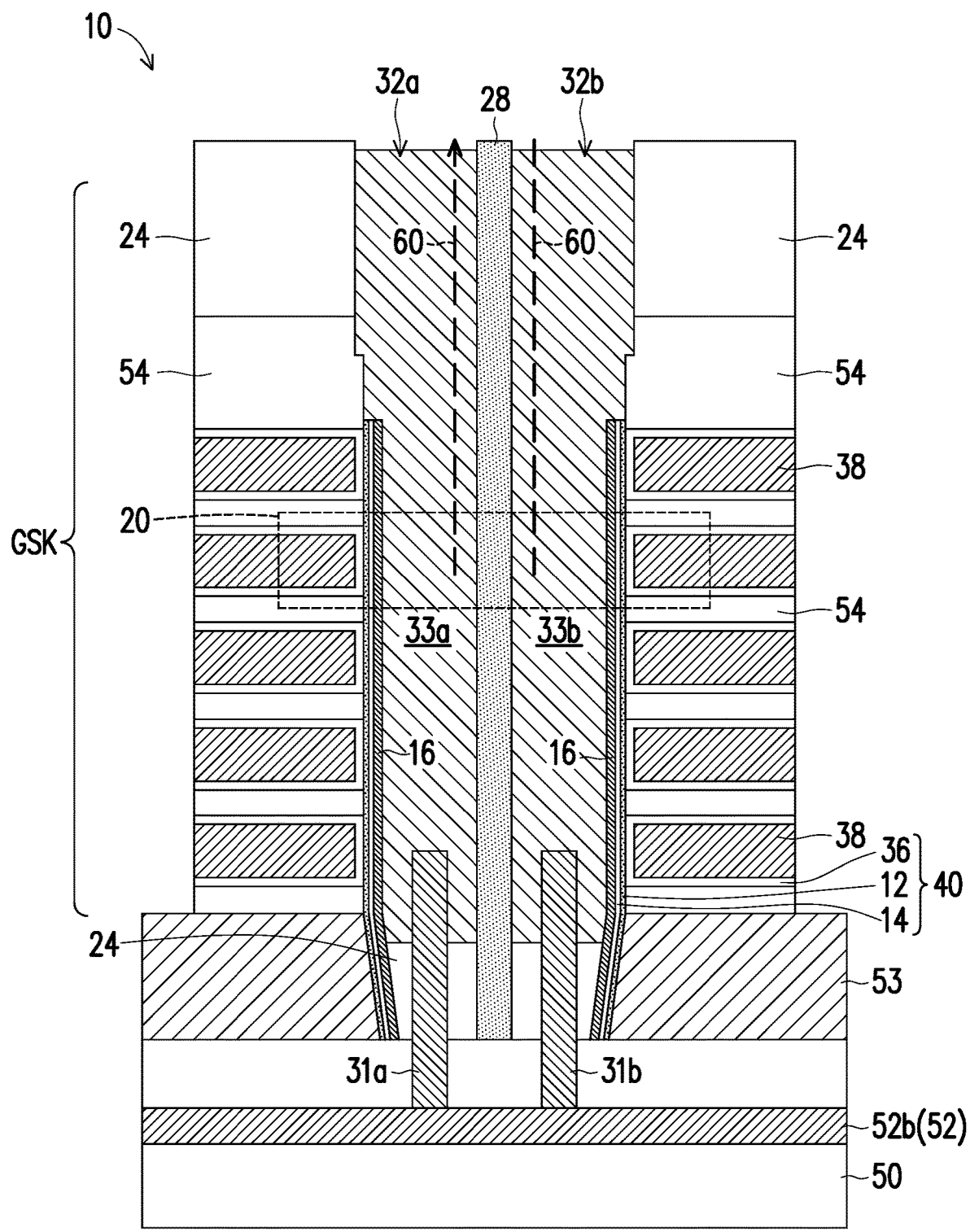

Referring to FIG. 2B, the stopper 52 is the stop layer 52b. The source pillar 32a and the drain pillar 32b in the same plane of the memory device may land on a same stop layer 52b. The stop layer 52b may be formed by first forming a stop film and then patterning through lithography etching processes. In some embodiments, the extension portions 31a and 31b of the source pillar 32a and the drain pillar 32b may be formed by an epitaxial growth process on the stop layer 52b.

Figure 2C:
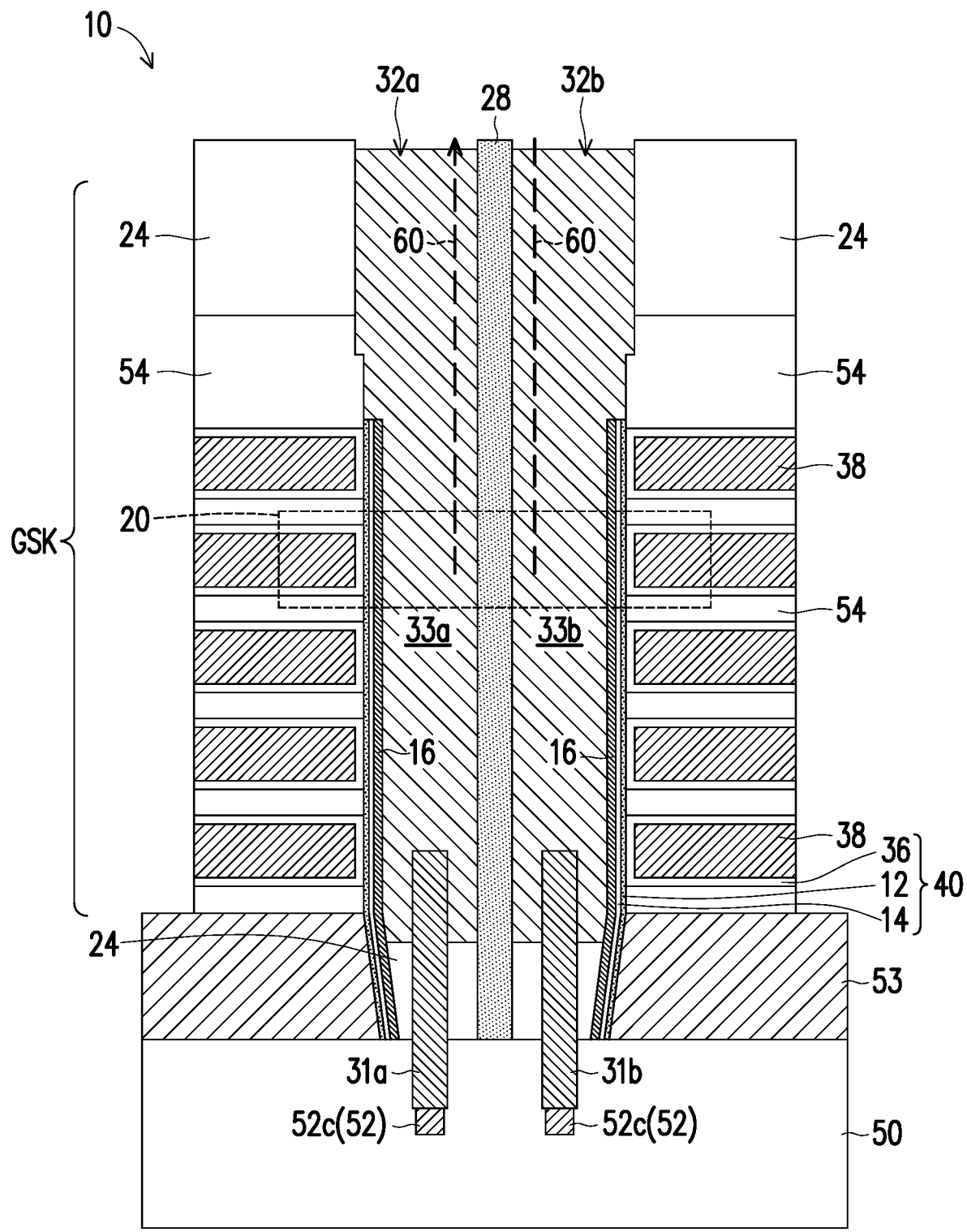

Referring to FIG. 2C, the stopper 52 is the stop grains 52c. The stopper 52 may be a single or multiple stop grains 52c. The stop grains 52c may be formed by chemical vapor deposition. In some embodiments, the extension portions 31a and 31b of the source pillar 32a and the drain pillar 32b may be formed by an epitaxial growth process on the stop grains 52c.

Figure 2D:
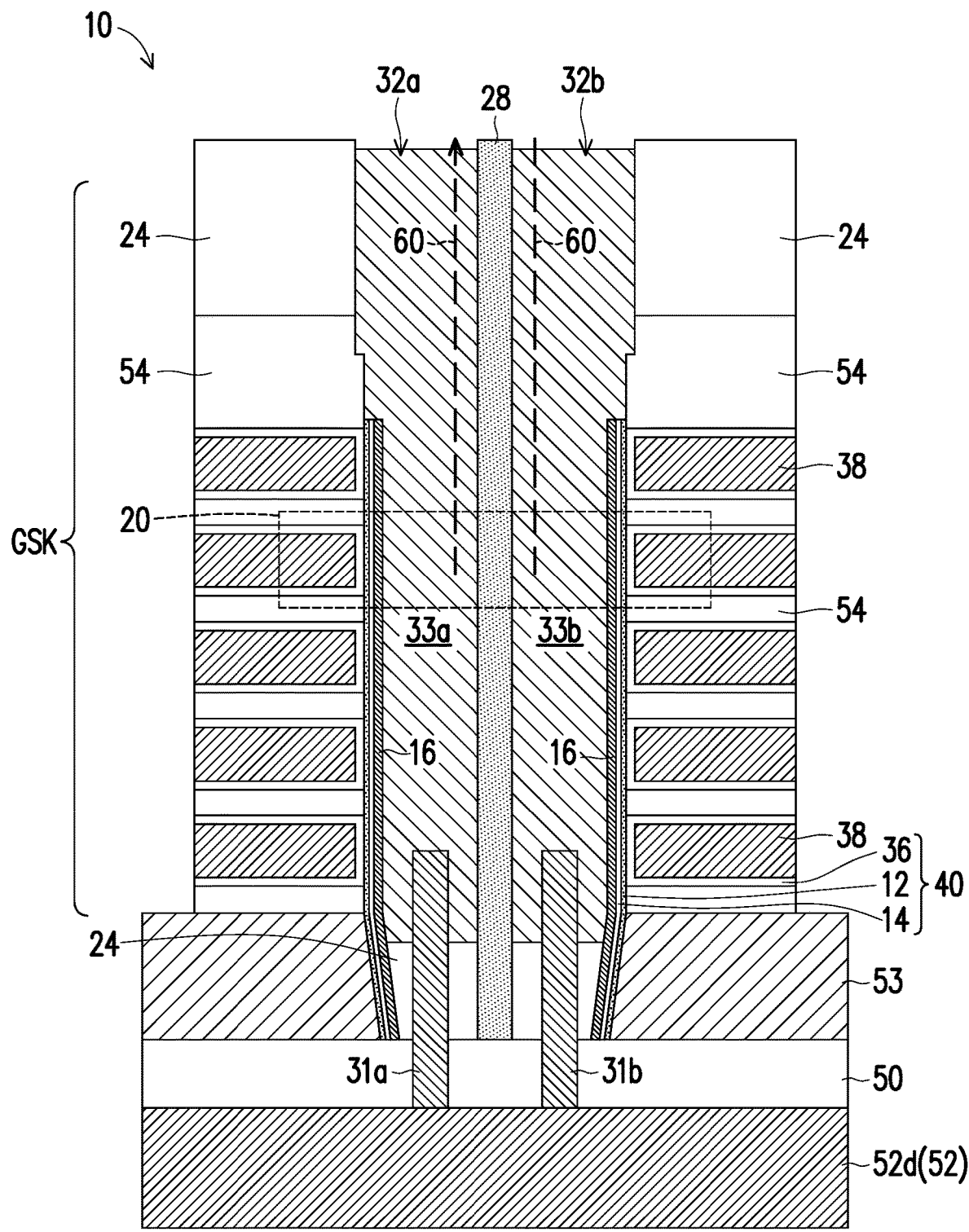

Referring to FIG. 2D, the stopper 52 is the substrate 52d. In other words, the source pillar 32a and the drain pillar 32b may land on the substrate 52d. In some embodiments, the extension portions 31a and 31b of the source pillar 32a and the drain pillar 32b may be formed by an epitaxial growth process on the substrate 52d.

Figure 1G:
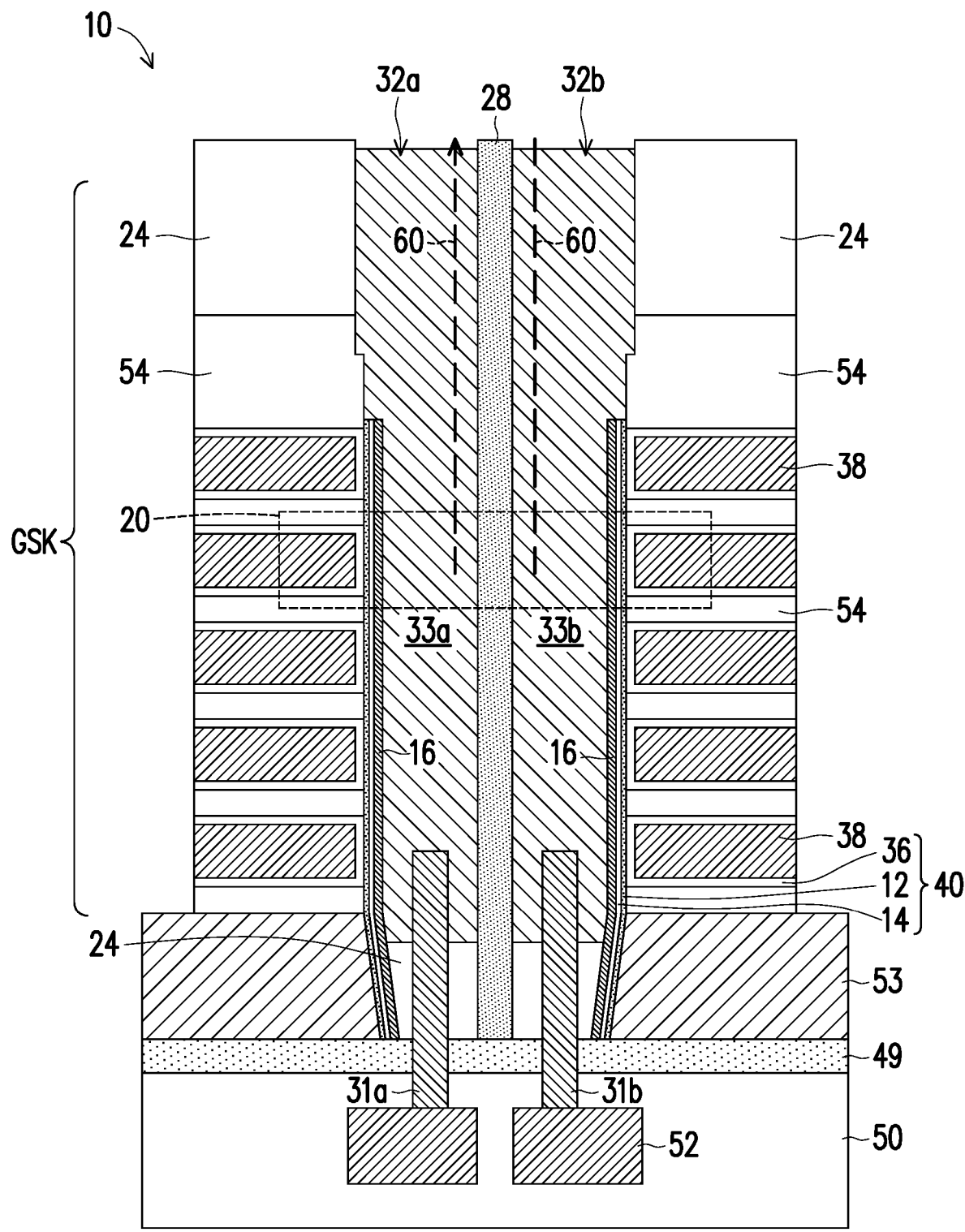
FIG. 1G to FIG. 1L show various partial simplified cross-sectional views of the memory array in FIG. 1A.
Figure 1H:
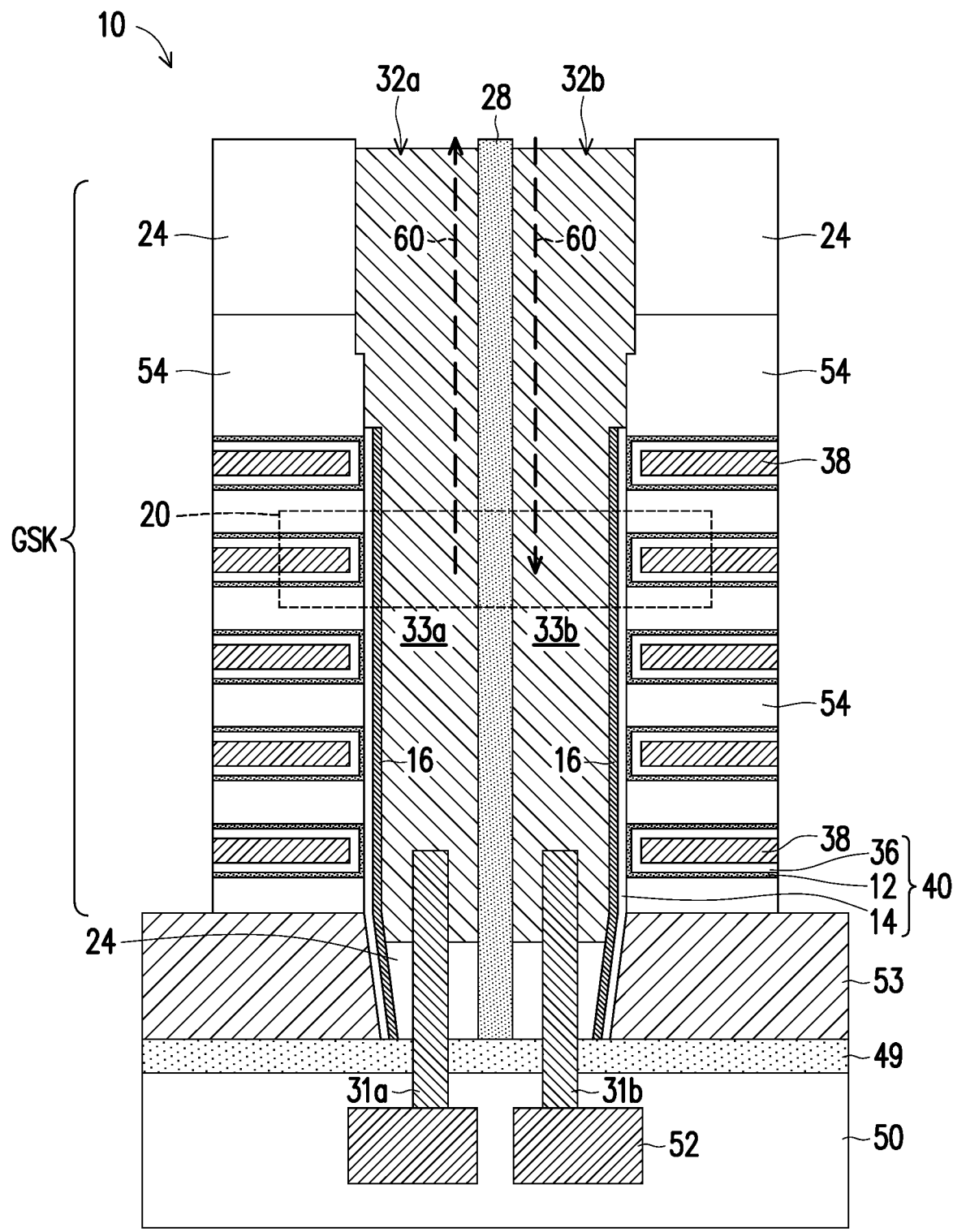

Referring to FIG. 1G and FIG. 1H, in some embodiments, a protection layer 49 is further included between the conductive layer 53 and the dielectric substrate 50. The protection layer 49 includes a single layer or multiple layers. In some embodiments, the protection layer 49 includes insulating material. For example, the insulating material includes silicon nitride, silicon oxide or a combination thereof. In other some embodiments, the protection layer 49 may further include a conductive material, and the conductive material is in an insulating material, or sandwiched between two or more insulating materials. The protection layer 49 may prevent the extension portions 31a and 31b of the source pillar 32a and the drain pillar 32b from being electrically connected to the conductive layer 53 due to lateral extension.

Figure 1I:
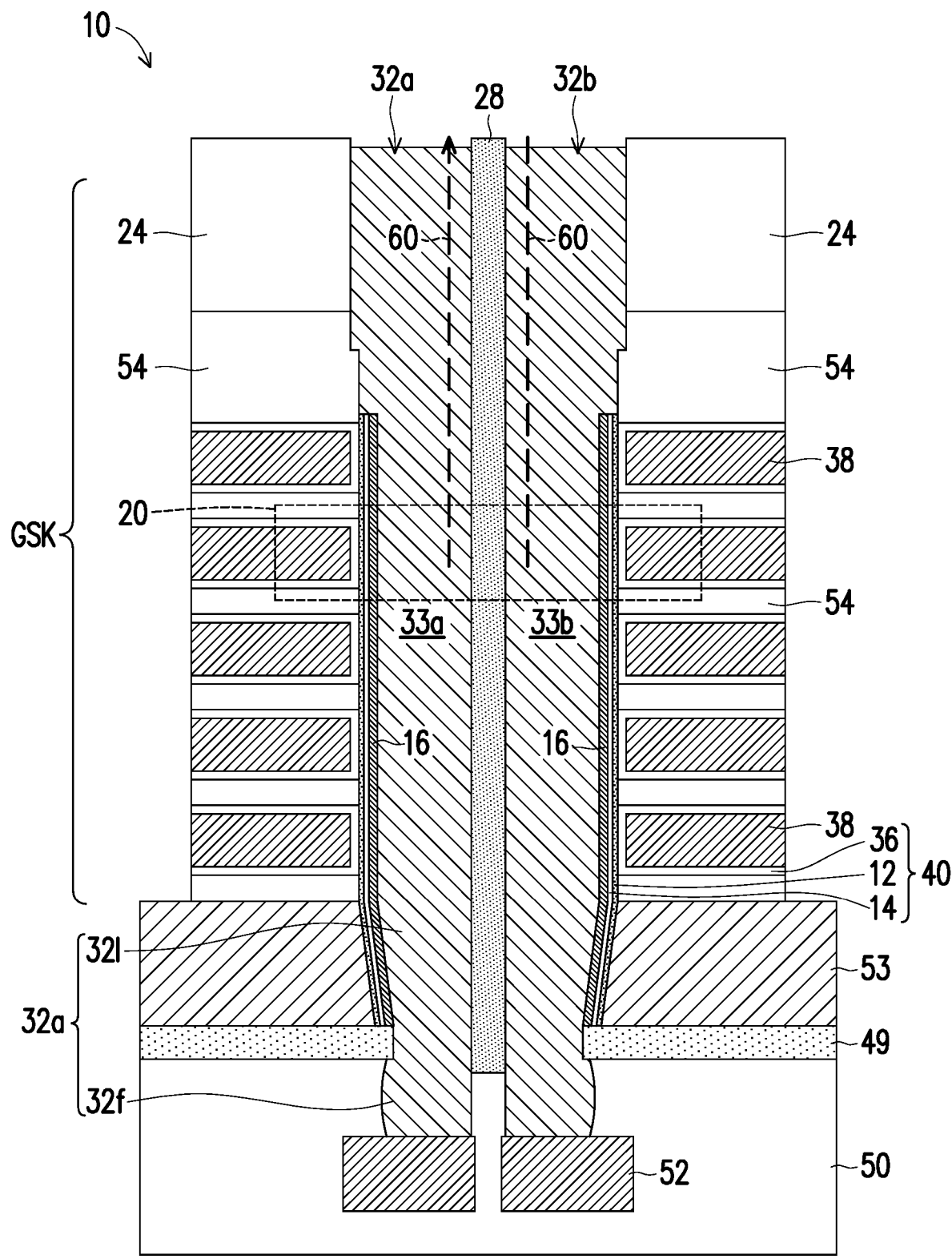
Figure 1J:
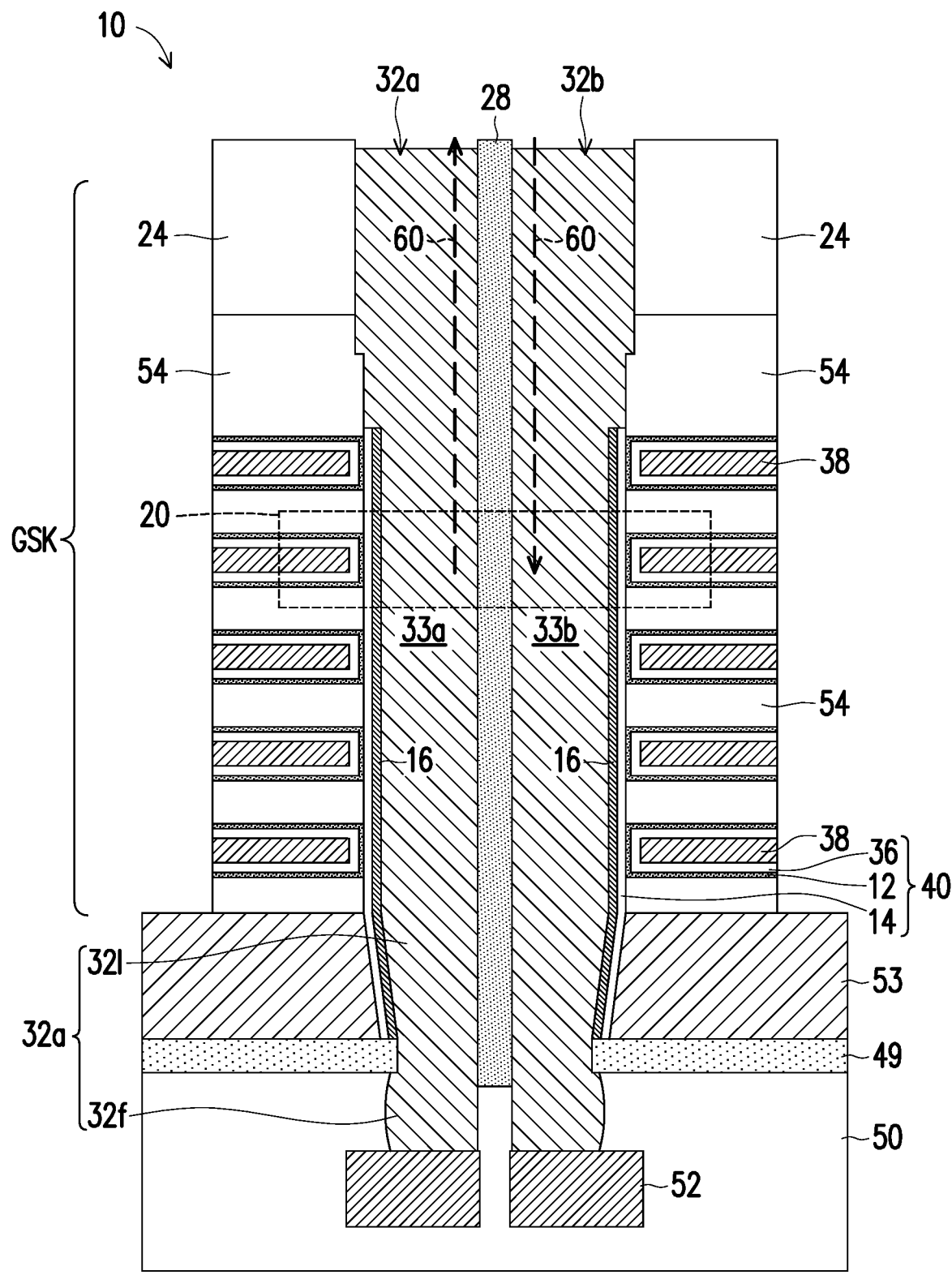

Referring to FIG. 1I and FIG. 1J, in other some embodiments, the source pillar 32a and the drain pillar 32b are continuous in its extending direction (e.g., in a direction perpendicular to the dielectric substrate 50) respectively. Each of the source pillar 32a and the drain pillar 32b includes a body portion 32l and a foot 32f which are electrically connected to each other. The body portion 32l extends through the gate stack structure GSK, the conductive layer 53 and the protection layer 49. The body portion 32l is in electrically contact with the sidewall of the channel pillar 16. The top surface of the foot 32f is connected to the body portion 32l. The bottom surface of foot 32f is landed on stopper 52. The body portions 32l and the foots 32f of the source pillar 32a and the drain pillar 32b may be formed the same material, such as doped polysilicon.

Referring to FIG. 1I and FIG. 1J, in some embodiments, the foot 32f also extends slightly laterally below the protection layer 49, so that the foot 32f and the charge storage structure 40 may be separated by the protection layer 49 to prevent the issue of short circuit between the foot 32f and the charge storage structure 40.

Figure 1K:
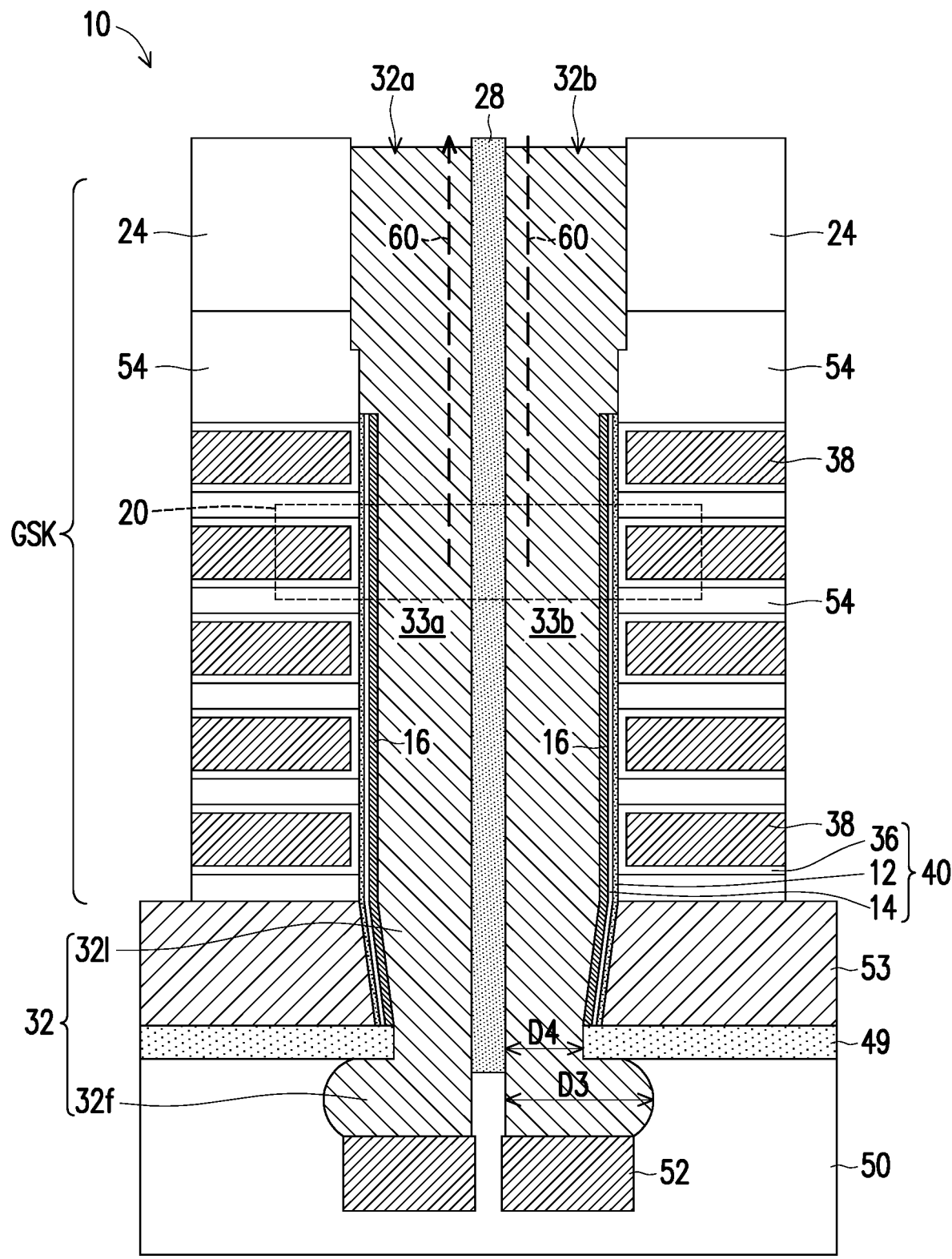
Figure 1L:
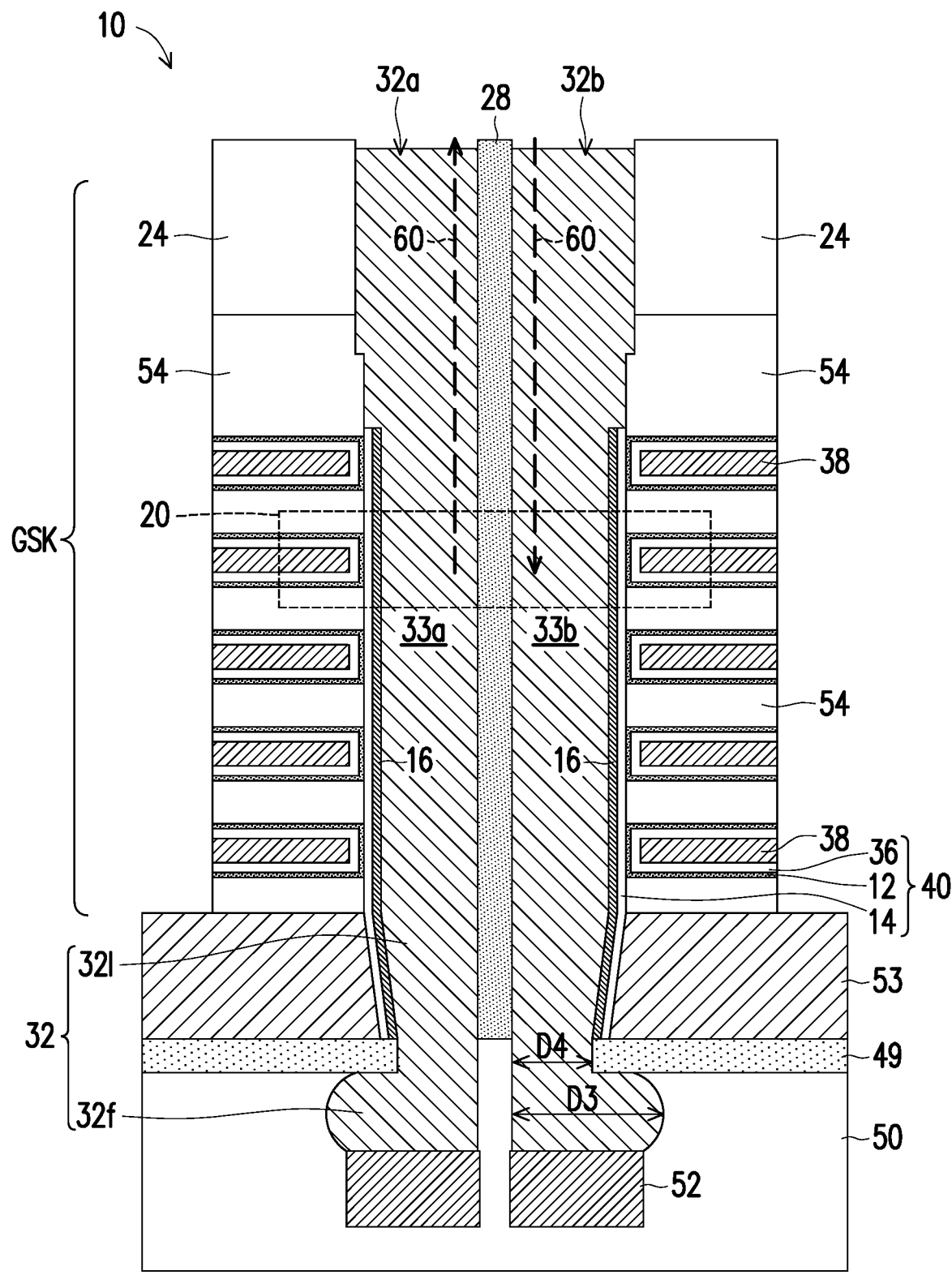

Referring to FIG. 1K and FIG. 1L, in other embodiments, due to the undercut factor of the etching process, the formed foot 32f further excessively extends laterally below the conductive layer 53. As a result, the maximum diameter D3 of the formed foot 32f is larger than the diameter D4 of the bottom of the body portion 32l. Due to the protection layer 49 is provided, the protection layer 49 may be sandwiched between the foot 32f and the conductive layer 53 to electrically isolate the foot 32f and the conductive layer 53.

FIG. 3A to FIG. 3I are schematic cross-sectional views of a manufacturing process of a memory device according to an embodiment of the present disclosure. The memory device may be a 3D AND flash memory device. The 3D AND flash memory device is described as an example as follows, but the present disclosure is not limited thereto.

Referring to FIG. 3A, a dielectric substrate 100 is provided. The dielectric substrate 100 is, for example, a dielectric layer (e.g., a silicon oxide layer) of a metal interconnect structure formed on a silicon substrate. The dielectric substrate 100 includes an array region (not shown) and a staircase region (not shown). A stack structure SK1 is formed on the dielectric substrate 100 in the array region and the staircase region. The stack structure SK1 may also be referred to as an intermediate stack structure SK1. In this embodiment, the stack structure SK1 is composed of insulating layers 104 and interlayers 106 that are alternately stacked alternately stacked on the dielectric substrate 100 in order. In other embodiments, the stack structure SK1 may be composed of interlayers 106 and insulating layers 104 that are alternately stacked on the dielectric substrate 100 in order. In addition, in this embodiment, the uppermost layer of the stack structure SK1 is the insulating layer 104. In this embodiment, the stack structure SK1 has six insulating layers 104 and five interlayers 106, but the disclosure is not limited thereto. In other embodiments, more insulating layers 104 and more interlayers 106 may be formed according to the actual requirements. The insulating layers 104 are silicon oxide, for example. The interlayers 106 are silicon nitride, for example. The interlayers 106 may serve as sacrificial layers which may be partially or entirely removed in the subsequent process.

In some embodiments, before the stack structure SK1 is formed, an insulating layer 101, a stopper 102 and a conductive layer 103. The insulating layer 101 is, for example, silicon oxide. The stopper 102 is formed in the insulating layer 101. The stopper 102 is, for example, a stop layer, stop bulks, stop grains, a substrate or a combination thereof. The material of stopper 102 is polysilicon, for example. The conductive layer 103 is a ground layer composed of polysilicon. The conductive layer 103 may be also referred to as dummy gates which are used to close the pathway of the leakage current. The stack structure SK1 is patterned to form a staircase structure (not shown) in the staircase region (not shown).

Next, referring to FIG. 3B, a plurality of openings 108 are formed in the stack structure SK1 in the array region. In this embodiment, the opening 108 extends through the stack structure SK1 and the conductive layer 103. In this embodiment, from a top view, the opening 108 has a circular profile (not shown), but the disclosure is not limited thereto. In other embodiments, the opening 108 may have other profile such as a polygonal profile (not shown).

Figures 3C, 3D:
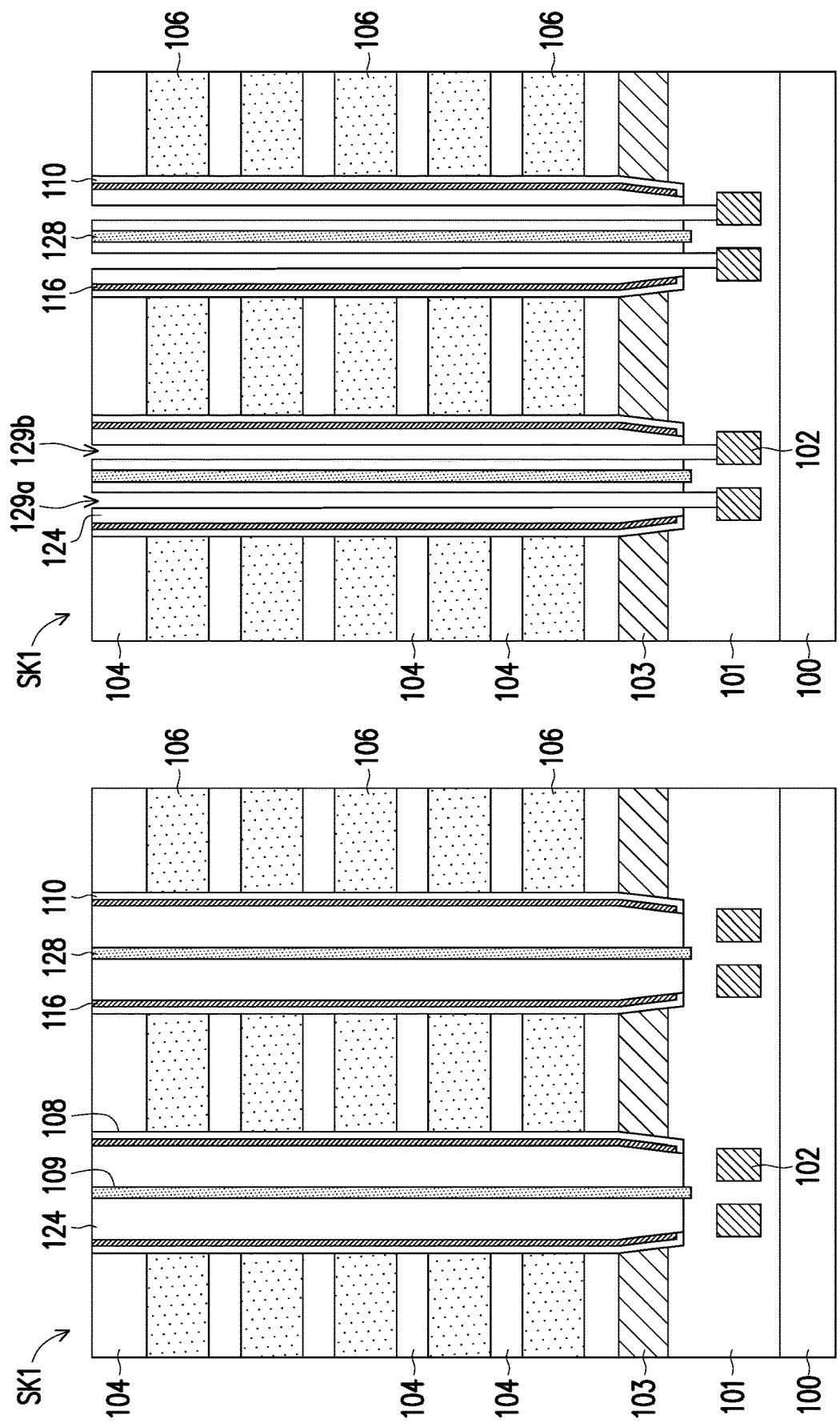

Referring to FIG. 3C, a liner layer 110 and a channel pillar 116 are formed in the opening 108. The material of the liner layer 110 is, for example, a silicon oxide. The material of the channel pillar 116 may be semiconductor such as undoped polysilicon. The method of forming liner layer 110 and the channel pillar 116 includes, for example, forming a lining material and a channel material on the stack structure SK1 and in the opening 108. Then, an etch-back process is performed to partially remove the lining material and the channel material to form the liner layer 110 and the channel pillar 116. The liner layer 110 and the channel pillar 116 cover the sidewall of the opening 108 and expose the bottom of the opening 108. The liner layer 110 and the channel pillar 116 may extend through the stack structure SK1 and extend into the insulating layer 101 (not shown), but the disclosure not limited thereto. The liner layer 110 and the channel pillar 116 may be continuous in its extending direction (e.g., in a direction perpendicular to the dielectric substrate 100). In other words, the liner layer 110 and the channel pillar 116 each is integral in its extending direction and is not divided into multiple disconnected parts. In a top view, the channel pillar 116 has, for example, a ring shape (not shown). In some embodiments, the channel pillar 116 may have a circular profile (not shown) in a top view, but the disclosure is not limited thereto. In other embodiments, the channel pillar 116 may also have other profile such as a polygonal profile in a top view (not shown).

Referring to FIG. 3C, an insulating filling material is formed on the stack structure SK1 and filled in the opening 108. The insulating filling material is, for example, low temperature silicon oxide. The insulating filling material filled in the opening 108 forms the insulating filling layer 124 and a circular void is left in the center of the insulating filling layer 124. Then, an anisotropic etching process is performed to expand the circular void to form a hole 109.

Referring to FIG. 3C, an insulating material layer is formed on the insulating filling layer 124 and in the holes 109. Then, an anisotropic etching process is performed to remove part of the insulating material layer to form an insulating pillar 128 in the hole 109. The material of the insulating pillar 128 is different from that of the insulating filling layer 124. The material of insulating pillar 128 is silicon nitride, for example.

Referring to FIG. 3D, a patterning process (e.g., photolithography and etching processes) is performed to form holes 129a and 129b in the insulating filling layer 124. In the etching process, the stopper 102 may serve as an etching stop layer. Therefore, the formed holes 129a and 129b through the stack structure SK1 and extend until the stopper 102 is exposed. The sidewalls of the holes 129a and 129b are surrounded by the insulating filling layer 124, and the bottom surfaces of the holes 129a and 129b expose the stopper 102.

Referring to FIG. 3E, extension portions 131a and 131b are formed in the holes 129a and 129b, respectively. The material of the extension portions 131a and 131b includes single crystal silicon. A method of forming the extension portions 131a and 131b is, for example, an epitaxial growth process. In some embodiments, the stopper 102 is single crystal silicon, so the stopper 102 may be used as a seed, and the extension portions 131a and 131b may be formed through an epitaxial growth process. The top surfaces of the extension portions 131a and 131b may be close to the top surface of the conductive layer 103 or higher than the top surface of the conductive layer 103. If the top surface of the extension portions 131a and 131b is lower than the bottom surface of the conductive layer 103, the subsequent formation of the body portions 133a and 133b (shown in FIG. 3G) is likely to cause a short circuit with the conductive layer 103. Therefore, the top surfaces of the extension portions 131a and 131b are at least higher than the bottom surface of the conductive layer 103. When the heights of the extension portions 131a and 131b are higher (for example, the top surfaces of the extension portions 131a and 131b are higher than the top surface of the conductive layer 103), the etching process window of the subsequent insulating filling layer 124 is larger, and a remaining insulating filling layer 124a (shown in FIG. 3F) may fully protect the extension portions 131a and 131b. The extension portions 131a and 131b may be completely isolated from the channel pillar 116 by the insulating filling layer 124a, and electrically isolated from the conductive layer 103 by the insulating layer 101.

Referring to FIG. 3F, an etching process, such as a wet etching process, is performed on the insulating filling layer 124 to remove the insulating filling layer 124 over the extension portions 131a and 131b to form holes 130a and 130b, and leave the insulating filling layer 124a. During the etching process, the extension portions 131a and 131b may be used as an etch stop layer. In other words, a part of the space of the holes 130a and 130b occupy the extension portions 131a and 131b, so that the amount of etchant in contact with the insulating filling layer 124 is reduced to more precisely control the amount (or the height) of the remaining insulating filling layer 124a. Therefore, the insulating filling layer 124 may be prevented from being excessively over-etched, and even the insulating filling layer 124 may be prevented from being excessively etched laterally to expose the conductive layer 103, resulting in a short circuit between the subsequent formed source pillar 132a (shown in FIG. 3G) and the conductive layer 103, or between the subsequent formed drain pillar 132b (shown in FIG. 3G) and the conductive layer 103. In one embodiment, the holes 130a and 130b expose the sidewalls of the channel pillars 116 and the top surfaces of the extension portions 131a and 131b, but do not expose the upper sidewalls of the extension portions 131a and 131b (not shown). In another embodiment, in order to ensure that the extension portions 131a and 131b may be exposed, an over etching process is performed, so that the sidewall of the channel pillar 116 and the top surfaces and the upper sidewalls of the extension portions 131a and 131b may be exposed by the holes 130a and 130b, as shown in FIG. 3F.

After the etch process is performed on the insulating filling layer 124, the top surface of the remaining insulating filling layer 124a is higher than the bottom surface of the conductive layer 103. In some embodiments, the top surface of the insulating filling layer 124a is between the top surface and the bottom surface of the conductive layer 103 (not shown). However, the present disclosure is not limited to there. In other embodiments, the top surface of the insulating filling layer 124a may be higher than the top surface of the conductive layer 103 and the top surfaces of the extension portions 131a and 131b may be exposed, as shown in FIG. 3F.

Referring to FIG. 3F, the insulating filling layer 124a is laterally around the sidewalls of the extension portions 131a and 131b. The insulating filling layer 124a may be used as an isolator to laterally isolate the extension portions 131a and 131b from the channel pillar 116 and to laterally isolate the extension portions 131a and 131b from the insulating pillar 128. In some embodiments, the height of the top surface of the insulating filling layer 124a is equal to the height of the top surface of the extension portions 131a and 131b, so that the top surface of the extension portions 131a and 131b is exposed by the top surface of the insulating filling layer 124a. In other some embodiments, the height of the top surface of the insulating filling layer 124a is lower than the height of the top surface of the extension portions 131a and 131b, so that the top surface and the upper sidewall of the extension portions 131a and 131b protrude from the top surface of the insulating filling layer 124a. Since the etch rate of the insulating pillar 128 is smaller than the etch rate of the insulating filling layer 124, the insulating pillar 128 is hardly damaged by the etchant and remains.

Figure 3H:
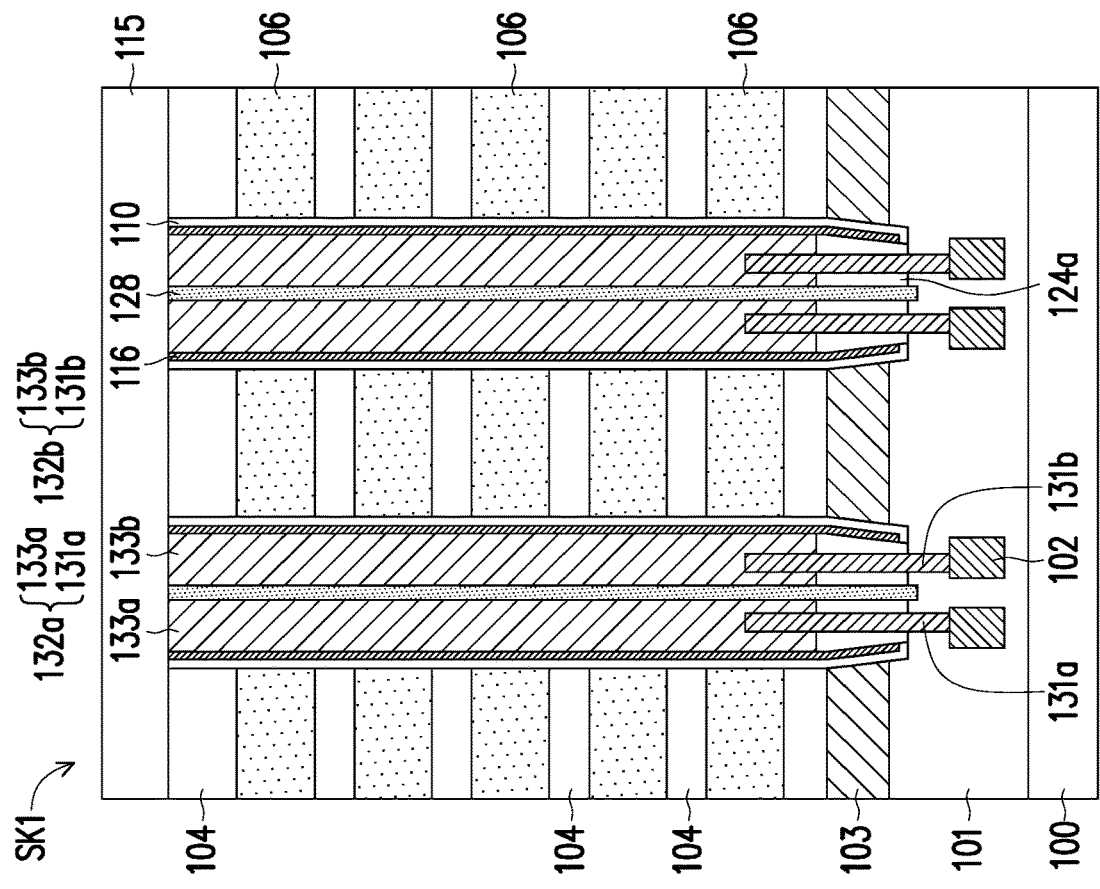
Figure 3G:
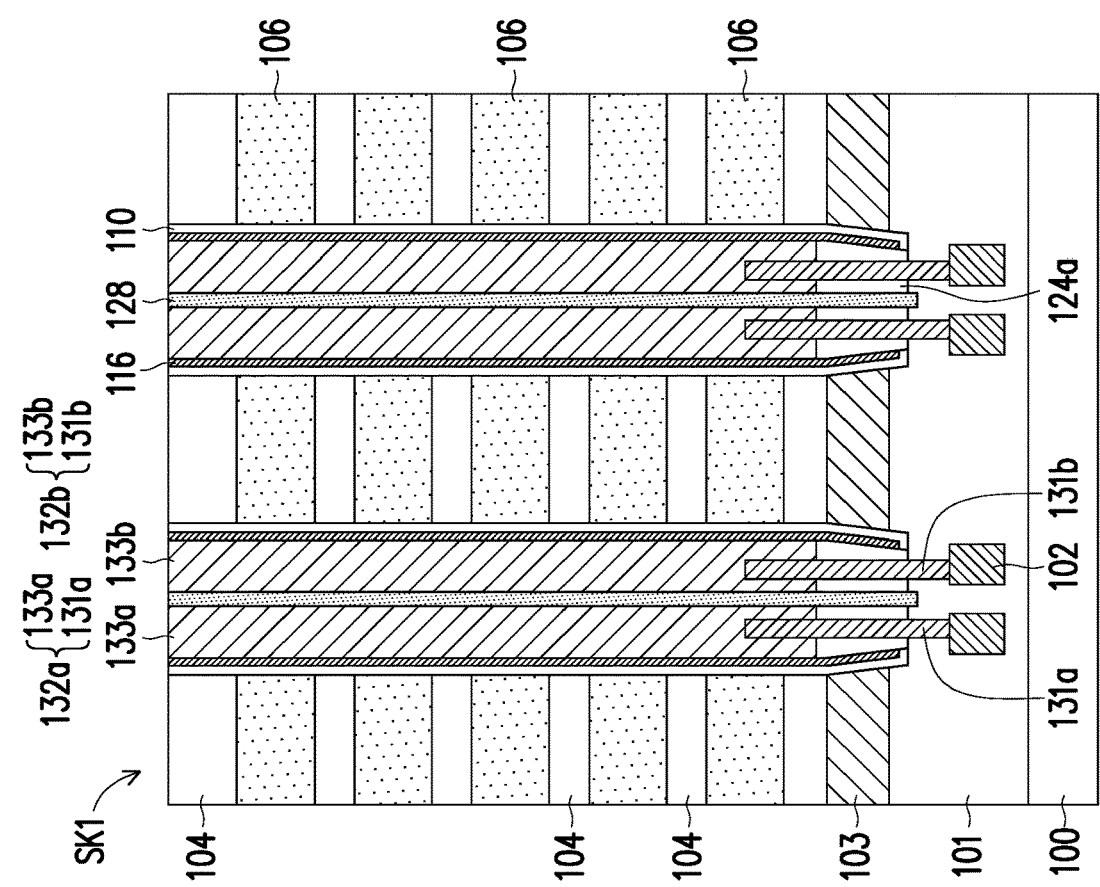

Referring to FIG. 3G, body portions 133a and 133b are formed in the holes 130a and 130b. The body portions 133a and 133b may form conductive pillars 132a and 132b together with the extension portions 131a and 131b, respectively. The conductive pillar 132a/132b may be used as a source pillar/a drain pillar to be electrically connected to the channel pillars 116 respectively. The body portions 133a and 133b may be formed by forming a conductive material on the substrate 100 and in the holes 130a and 130b, and then an etching back process is performed. The body portions 133a and 133b may be doped polysilicon.

Referring to FIG. 3H, next, a capping insulating layer 115 is formed on the stack structure SK1, the channel pillar 116, the conductive pillars 132a and 132b, the insulating filling layer 124, and the insulating pillar 128. The material of the capping insulating layer 115 is silicon oxide, for example.

Figure 3I:
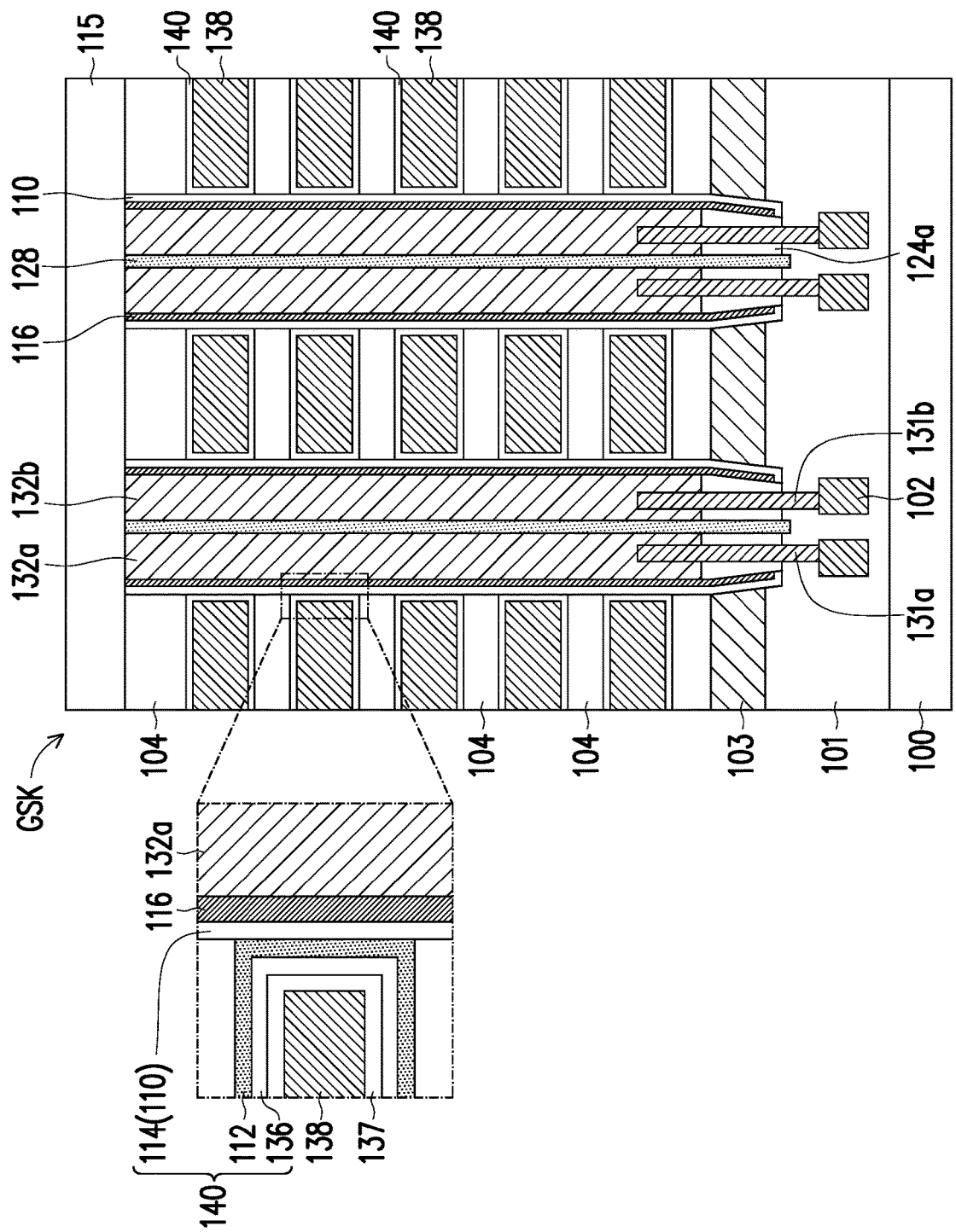

Referring to FIG. 3I, next, a patterning process (e.g., lithography and etching processes) is performed on the capping insulating layer 115 and the stack structure SK1 to form a slit trench (not shown). During the etching process, the insulating layer 101 may be used as the etch stop layer, so that the insulating layer 101 is exposed by the slit trench. The capping insulating layer 115 and the stack structure SK1 are divided into a plurality of blocks by the slit trench (not shown).

Referring to FIG. 3I, an etching process (e.g., a wet etching process) is performed to partially remove the insulating layers 104. The etchant (e.g., hot phosphoric acid) used in the etching process is injected into the slit trench 133, and potions of the insulating layers 104 which are in contact with the etching solution are removed. By using a time mode control, most of the insulating layers 104 may be removed to form a plurality of horizontal openings 120.

Referring to FIG. 3I, a replacement process is performed to replace the plurality of interlayers 106 with a plurality of gate layers 138 and a plurality of charge storage structures 140. The charge storage structures 140 includes a tunneling layer 114, a charge storage layer 112, and a blocking layer 136. The liner layer 110 may be removed or left. In the embodiment in which the liner layer 110 is not removed, the liner layer 110 may be used as the tunneling layer 114, and the step of forming another tunneling layers may be omitted or additionally formed in the plurality of horizontal openings 134. In the embodiment in which the liner layer 110 is removed, tunneling layers 114 are additionally formed in the plurality of horizontal openings 134. The charge storage layer 112 is silicon nitride, for example. The blocking layers 136 are, for example, silicon oxide, a material with high dielectric constant greater than or equal to 7, or a combination thereof. The material with high dielectric constant greater than or equal to 7 may be aluminum oxide ($Al_2O_3$), hafnium oxide ($HfO_2$), lanthanum oxide ($La_2O_5$), a transition metal oxide, a lanthanide oxide, or combinations thereof. The gate layers 138 include, for example, tungsten. In some embodiments, barrier layers 137 are also formed before the plurality of gate layers 138 are formed. The barrier layers 137 are, for example, titanium (Ti), titanium nitride (TiN), tantalum (Ta), tantalum nitride (TaN) or a combination thereof.

Referring to FIG. 3I, the formation method of the tunneling layers 114, the charge storage layers 112, the blocking layers 136, the barrier layers 137, and the gate layers 138 includes, for example, the following steps. A tunnel material, a storage material, a blocking material, a barrier material, and a conductive material are sequentially formed in the slit trench and the horizontal openings 134. An etching back process is then performed to remove the tunneling material, the storage material, the barrier material, the barrier material and the conductor material in the plurality of slit trench to form the tunneling layers 114, the charge storage layers 112, the blocking layers 136, the barrier layers 137, and the gate layers 138 in the plurality of horizontal openings 134. So far, the gate stack structure GSK is formed. The gate stack structure GSK is disposed over the dielectric substrate 100 and includes the plurality of gate layer 138 and the plurality of insulating layer 104 which are stacked alternately with each other.

Referring to FIG. 3I, a slit structure (not shown) is formed in the slit trench. The method for forming the slit structure includes forming an insulating liner material and a conductive material over the gate stack structure GSK and filling in the slit trench. The insulating liner material is, for example, silicon oxide. The conductive material is, for example, polysilicon. Then, the excess insulating liner material and the excess conductive material over the gate stack structure GSK are removed through an etching back process or a planarization process to form a liner layer and a conductive layer. The liner layer and the conductive layer are collectively referred to as the slit structure. In other embodiments, the slit structure may also be filled with the insulating material without any conductive layer. In still other embodiments, the slit structure may also be the liner layer, and the liner layer has an air gap therein without any conductive layer.

After that, a plurality of contacts (not shown) are formed in the staircase region. The contact lands on the end of the gate layer 138 in the staircase region, and is electrically connected to the gate layer 138 respectively.

FIG. 4A to FIG. 4F are schematic cross-sectional views of a manufacturing process of a memory device according to another embodiment of the present disclosure. FIG. 5A to FIG. 5C are schematic cross-sectional views of a manufacturing process of a memory device according to yet another embodiment of the present disclosure. The memory device may be a 3D AND flash memory device. The 3D AND flash memory device is described as an example as follows, but the present disclosure is not limited thereto.

Referring to FIG. 4A, an insulating layer 101, a stopper 102, a conductive layer 103 and a stack structure SK1 are formed on the substrate 100 according to the above method. In this embodiment, before the conductive layer 103 is formed, a protection layer 149 is formed on the insulating layer 101 first. The material of the protection layer 149 is different from the materials of the conductive layer 103 and the insulating layer 101. The protection layer 149 includes a single layer or multiple layers. The protection layer 149 includes an insulating material. The insulating material includes silicon nitride, silicon oxide or a combination thereof. The protection layer 149 may further include conductive material, which is located in the insulating material. The formation method of the protection layer 149 is, for example, a chemical vapor deposition.

Referring to FIG. 4B, a plurality of openings 108 are formed in the stack structure SK1 in the array region. In this embodiment, the openings 108 extends through the stack structure SK1, the conductive layer 103 and the protection layer 149.

Referring to FIG. 4C, a liner layer 110 and a channel pillar 116 are formed in the opening 108. Next, the insulating filling layer 124 and the insulating pillar 128 are formed in the opening 108. The liner layer 110, the channel pillar 116, the insulating filling layer 124 and the insulating pillar 128 may be formed by the same method as described above.

Referring to FIG. 4D, a patterning process (e.g., photolithography and etching processes) is performed to form holes 130a and 130b in the insulating filling layer 124. In the etching process, the stopper 102 may be used as an etch stop layer. The formed holes 130a and 130b extend through the stack structure SK1 to expose the stop layer 102. The etching process is, for example, an anisotropic process, such as a dry etch process. Afterward, an isotropic etching process (e.g., a wet etching process) is performed. During the isotropic etching process, the etchant will etch the insulating layer 101 laterally and cause undercut, so that holes 130f are formed. The hole 130l extends through the stack structure SK1 in the longitudinal direction to expose the stopper 102. The hole 130f is below the hole 130l and are spatial communicated with the hole 130l to form the holes 130a and 130b. In some embodiments, the hole 130f extends laterally to expose the bottom of the liner layer 110, as shown in FIG. 4D. In other embodiments, the hole 130f extends laterally, not only exposing the bottom of the liner layer 110, but also extending to the bottom of the conductive layer 103, as shown in FIG. 5A. Referring to FIG. 5A, the hole 130f extends below the conductive layer 103 and exposes the protection layer 149. In other words, the protection layer 149 may protect the conductive layer 103 and prevent the conductive layer 103 from being exposed during the formation of the holes 130a and 130b, thereby avoiding the problem of short circuit between conductive pillars 132a and 132b (which are to be formed in the holes 130a and 130b) and the conductive layer 103.

Figure 4E:
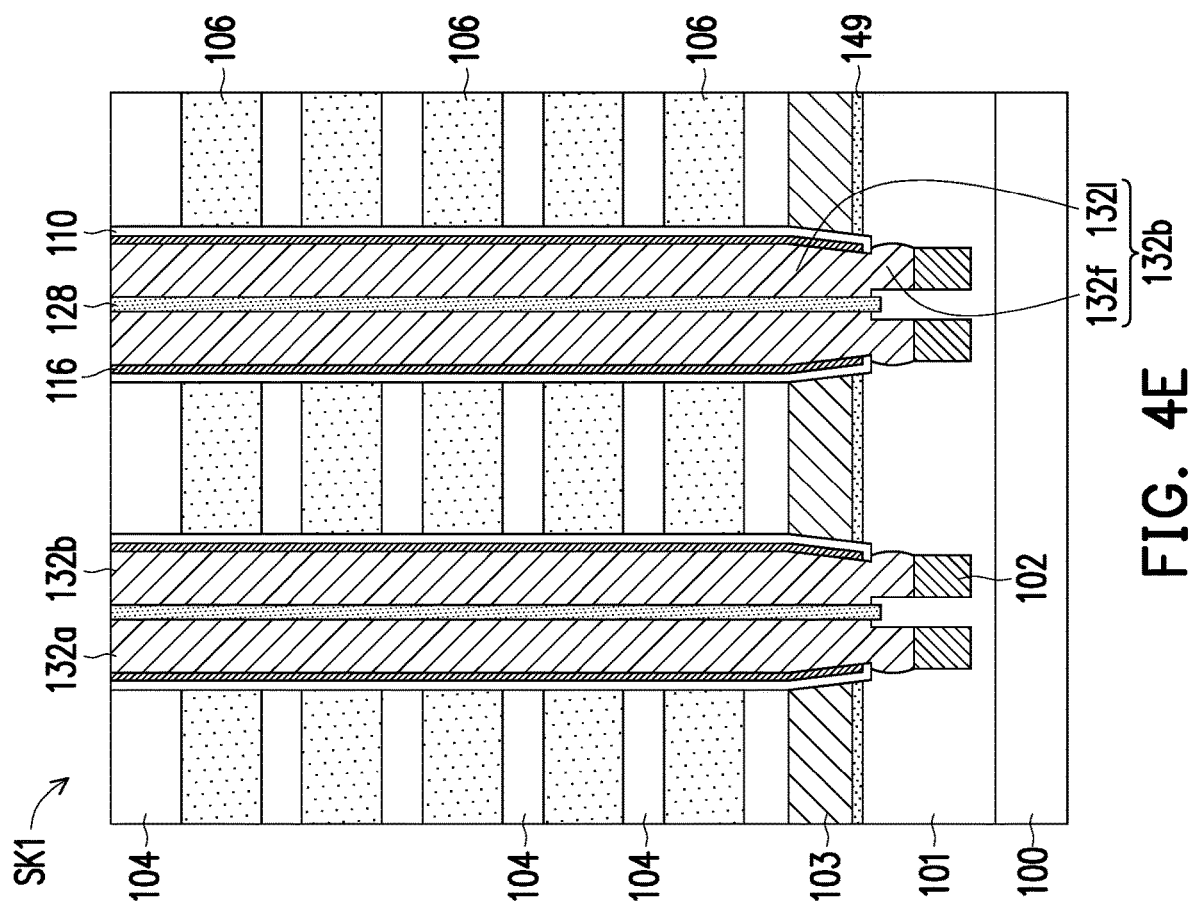
Figure 5C:
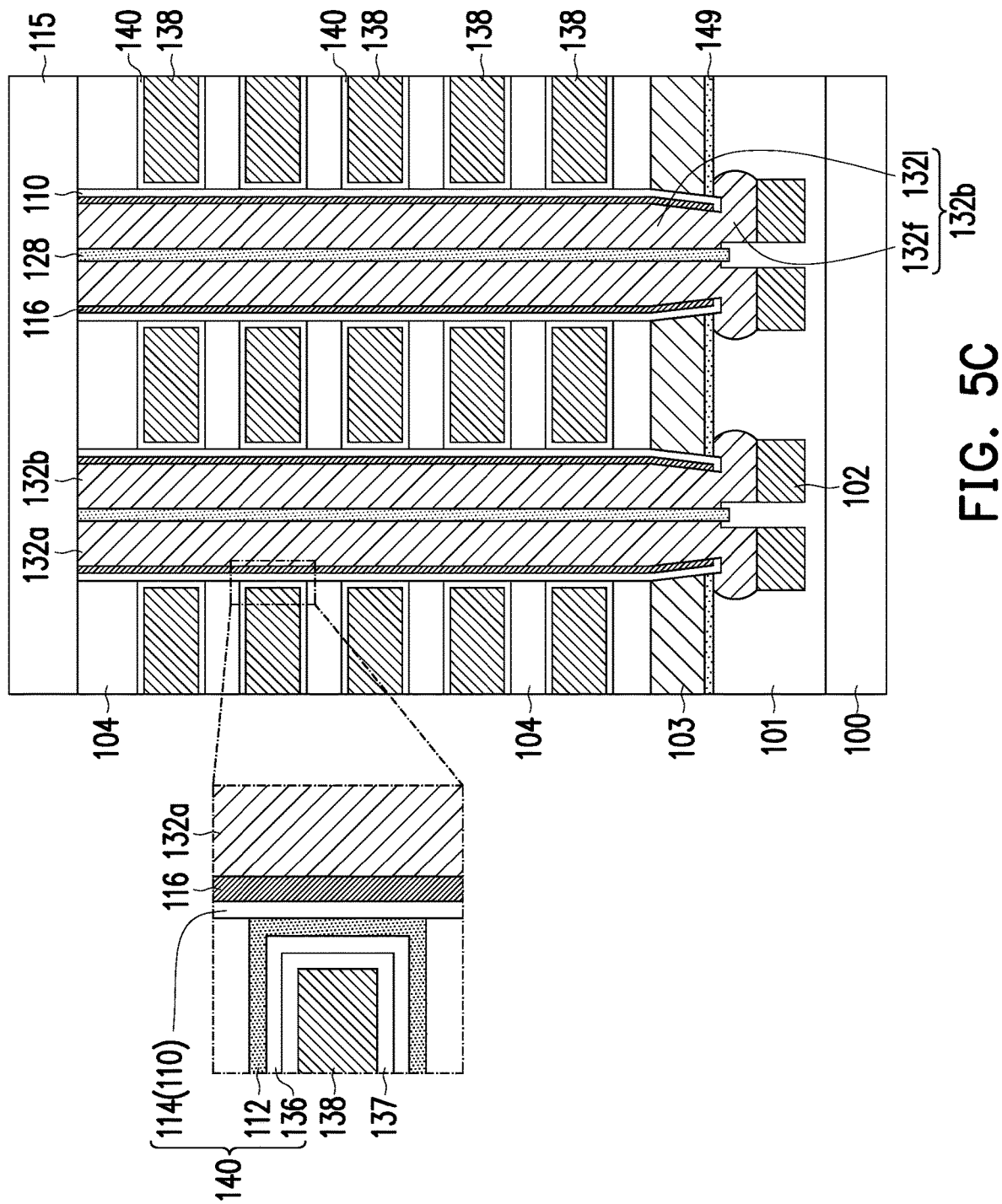

FIG. 4E and FIG. 5B, conductive pillars 132a and 132b are formed in the holes 130a and 130b. The conductive pillars 132a and 132b include doped polysilicon. The conductive pillars 132a and 132b may be used as source pillars and drain pillars to be electrically connected to the channel pillars 116 respectively. Each of the conductive pillar 132a and 132b may include a body portion 132l and a foot 132f connected to each other. The body portion 132l is filled in the hole 130f. The foot 132f is filled in the hole 130f. Referring to FIG. 5B, the foot 132f and the conductive layer 103 overlap in the longitudinal direction, but are electrically isolated from each other by the protection layer 149, so the issue of short circuit may be avoided.

Figure 4F:
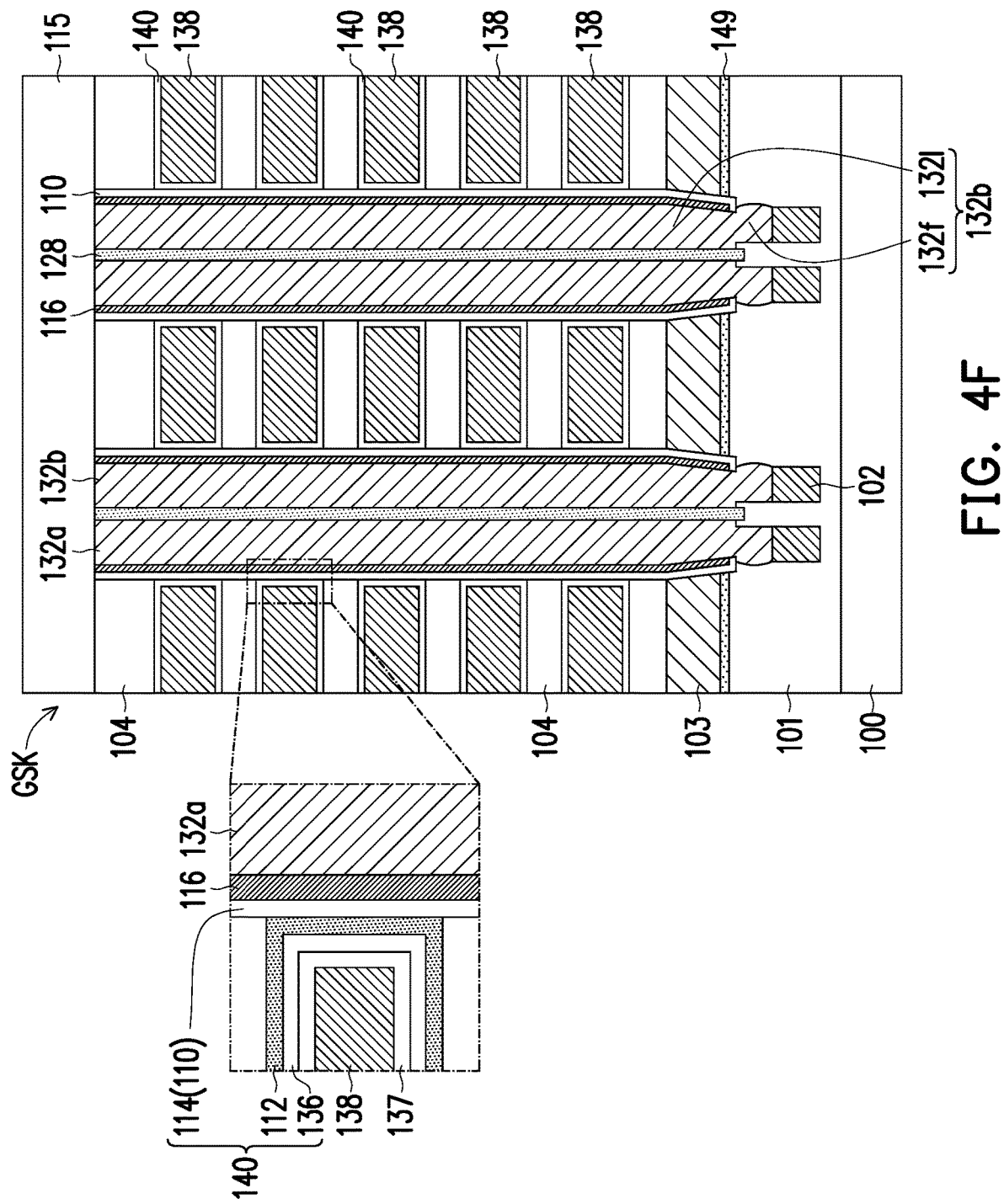

Referring to FIG. 4F and FIG. 5C, a replacement process is performed on the interlayers 106 according to the above method to form the charge storage structure 140 and the gate layer 138.

Figure 6:
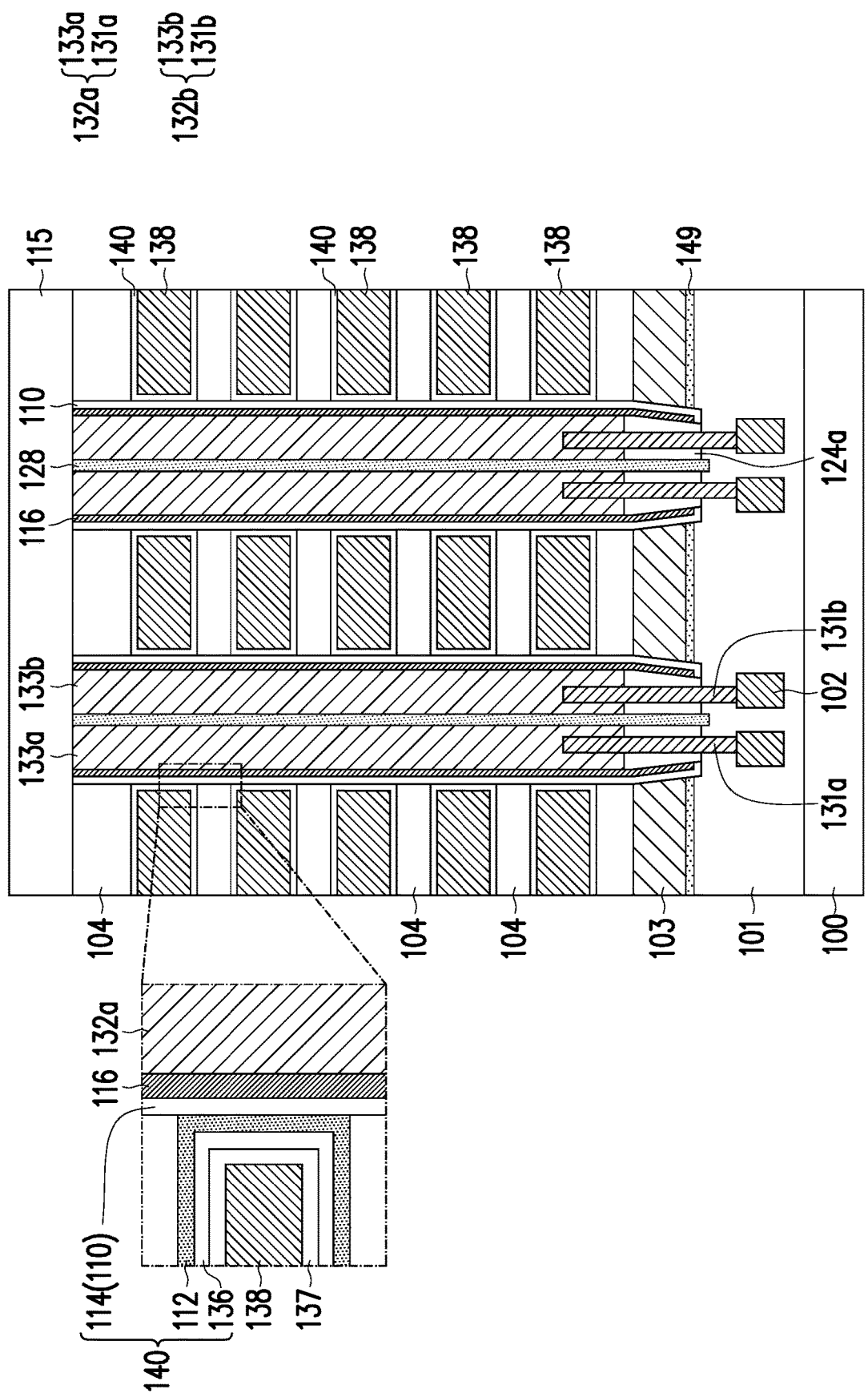
FIG. 6 is a schematic cross-sectional view of a memory device according to yet another embodiment of the present disclosure.

The aforementioned protection layer 149 may also be used in the aforementioned embodiments, and the formed memory device is shown in FIG. 6.

The above description takes a three-dimensional AND flash memory device as an example. However, the present invention is not limited to this. In other embodiments, the above-mentioned memory device and its manufacturing method may also be applied to a three-dimensional NOR flash memory device and its manufacturing method, and so on. In the memory device of the present disclosure embodiment, the diameter of the lower portion of the conductive pillars (e.g., the source pillar or the drain pillar) is reduced to electrically isolate with the channel pillar, or a protection layer is disposed under the ground conductive layer, so that the issue of short circuit between conductive pillars (e.g., the source pillar and the drain pillar) and the grounded conductive layer may be avoided.

The method of manufacturing the memory device of the present disclosure embodiment may be integrated with the existing process, and the process window may be increased.

What is claimed is:

1. A memory device, comprising:
   a gate stack structure, located over a dielectric substrate, wherein the gate stack structure comprises a plurality of gate layers and a plurality of insulating layers stacked alternately with each other;
   a channel pillar extending through the gate stack structure;
   a plurality of conductive pillars, wherein each of the conductive pillars comprises:
      a body portion extending through the gate stack structure, wherein the body portion is electrically connected to the channel pillar; and
      an extension portion below and connected to the body portion, wherein the extension portion is electrically isolated from the channel pillar; and
   a charge storage structure between the channel pillar and the plurality of gate layers, wherein
   a top surface and an upper sidewall of the extension portion are covered by the body portion.

2. The memory device of claim 1, further comprising an isolator located between the extension portion and the channel pillar.

3. The memory device of claim 1, wherein there is an interface between the extension portion and the body portion.

4. The memory device of claim 1, wherein a number of crystal phases of the extension portion is lower than a number of crystal phases of the body portion.

5. The memory device of claim 1, wherein a material of the extension portion comprises single crystal silicon, and a material of the body portion comprises doped polysilicon.

6. The memory device of claim 1, further comprising:
   conductive layer, located between the gate stack structure and the dielectric substrate;
   a stopper located between the conductive layer and the dielectric substrate, wherein the extension portion extends through the conductive layer and lands on the stopper; and
   an insulating pillar extending through the gate stack structure and the conductive layer, wherein the insulating pillar separates the plurality of conductive pillars and is laterally spaced from the extension portion by a non-zero distance.

7. The memory device of claim 6, wherein the stopper comprises a stop layer, stop bulks, stop grains, a substrate or a combination thereof.

8. A memory device, comprising:
   a protection layer, located over a dielectric substrate;
   a conductive layer, located on the protection layer;

a gate stack structure located above the conductive layer, and the gate stack structure comprises a plurality of gate layers and a plurality of insulating layers stacked alternately with each other;

a channel pillar, extending through the gate stack structure, the conductive layer and the protection layer;

a plurality of conductive pillars extending through the gate stack structure, the conductive layer and the protection layer, wherein the plurality of conductive pillars are electrically connected to the channel pillar; and a charge storage structure between the channel pillar and the plurality of gate layers, wherein each of the plurality of conductive pillar comprises:
- a body portion extending through the gate stack structure, the conductive layer and the protection layer, wherein the body portion is electrically connected to a sidewall of the channel pillar; and
- a foot, connected to the body portion and extending laterally such that the protection layer is sandwiched between the foot and the conductive layer.

9. The memory device of claim 8, further comprising:
a stopper between protection layer and the dielectric substrate, wherein the foot lands on the stopper.

10. The memory device of claim 8, wherein the protection layer comprises a single layer or multiple layers.

11. The memory device of claim 8, wherein the protection layer comprises an insulating material.

12. The memory device of claim 11, wherein the insulating material comprises silicon nitride, silicon oxide, or a combination thereof.

13. The memory device of claim 11, wherein the protection layer further comprises a conductive material in the insulating material.

14. A method of manufacturing a memory device, comprising:
forming a stopper over a dielectric substrate;
forming a conductive layer over the stopper;
forming a stack structure on the conductive layer, wherein the stack structure comprises a plurality of interlayers and a plurality of insulating layers stacked alternately with each other;
forming an opening in the stack structure;
forming a channel pillar in the opening;
forming an insulating filling layer in the opening;
forming an insulating pillar in a remaining space of the opening;
forming a plurality of first holes in the insulating filling layer, wherein the stopper is exposed to the plurality of first holes;
forming a plurality of extension portions in the plurality of first holes;
removing a portion of the insulating filling layer exposed by the plurality of first hole to form a plurality of second holes, wherein top surfaces of the plurality of extension portions are exposed to the plurality of second hole;
forming a plurality of body portions in the plurality of second holes, wherein the body portions are connected to the extension portions, and together with the plurality of extension portions form a plurality of conductive pillars;
replacing the plurality of interlayers with a plurality of gate layers; and
forming a plurality of charge storage structures between the plurality of gate layers and the channel pillar, wherein
removing the portion of the insulating filling layer so that another remaining portion of the insulating filling layer form an isolator located between the extension portion between the channel pillars.

15. The method of claim 14, wherein the stopper comprises polysilicon, and the forming the plurality of extension portions comprises an epitaxial growth process.

16. The method of claim 14, further comprising forming a protection layer between the conductive layer and the stopper.

* * * * *